United States Patent
Satou et al.

(10) Patent No.: US 6,590,280 B2
(45) Date of Patent: Jul. 8, 2003

(54) DISK-LIKE GETTERING UNIT, INTEGRATED CIRCUIT, ENCAPSULATED SEMICONDUCTOR DEVICE, AND METHOD FOR MANUFACTURING THE SAME

(75) Inventors: Fuminori Satou, Kanagawa-ken (JP); Makoto Uchiyama, Kanagawa-ken (JP); Masaki Hirota, Kanagawa-ken (JP)

(73) Assignee: Nissan Motor Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/960,975

(22) Filed: Sep. 25, 2001

(65) Prior Publication Data

US 2002/0037633 A1 Mar. 28, 2002

(30) Foreign Application Priority Data

Sep. 26, 2000 (JP) ......................... 2000-292621

(51) Int. Cl.⁷ .................. H01L 23/18; H01L 21/322
(52) U.S. Cl. ...................... 257/682; 438/476
(58) Field of Search ................. 257/678, 682; 438/58, 106, 115, 124, 126, 127, 471, 476

(56) References Cited

U.S. PATENT DOCUMENTS

| 5,493,177 A | * | 2/1996 | Muller et al. ............... 313/578 |
| 5,812,159 A | * | 9/1998 | Anagnostopoulos et al. .. 347/17 |
| 5,866,978 A | * | 2/1999 | Jones et al. .................. 313/481 |

FOREIGN PATENT DOCUMENTS

JP 11-339635 * 12/1999 ............. H01J/1/30

* cited by examiner

*Primary Examiner*—Evan Pert
(74) *Attorney, Agent, or Firm*—McDermott, Will & Emery

(57) ABSTRACT

A gettering unit encompasses a silicon substrate, a thin film heater disposed on the silicon substrate, and a gettering layer disposed selectively on the thin film heater. Here, the thin film heater is made of metallic film such as platinum (Pt) or chromium (Cr) film. The area of the gettering layer is smaller than the area for the thin film heater so as to expose first and second end terminals of the thin film heater. The first and second end terminals of the thin film heater serves as the bonding pads in the assembling process.

23 Claims, 17 Drawing Sheets

FIG.5A
FIG.5B
FIG.6A
FIG.6B
FIG.7A
FIG.7B
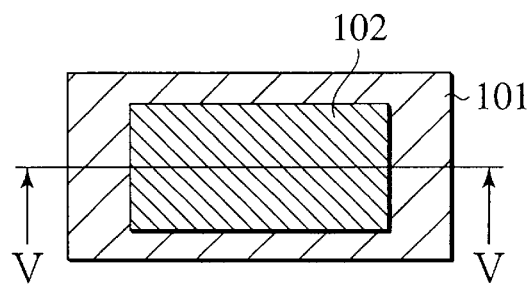
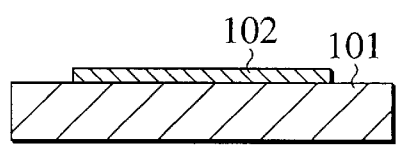
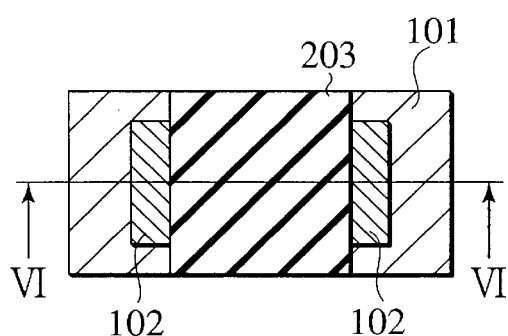
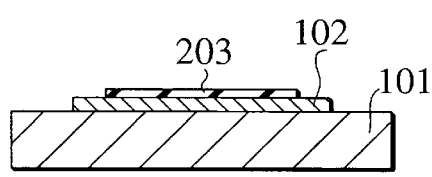
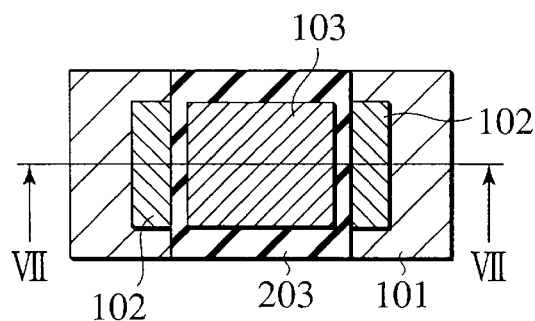
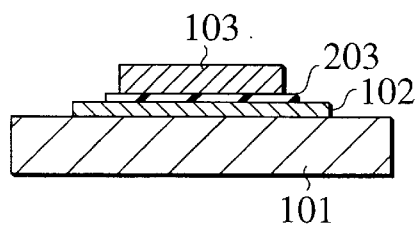

FIG.8A
FIG.8B
FIG.9A
FIG.9B
FIG.10A
FIG.10B
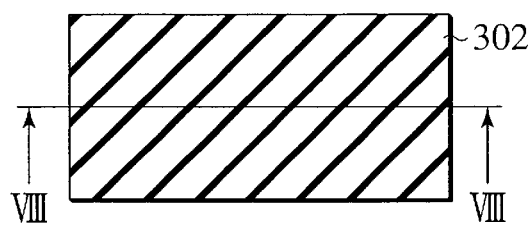
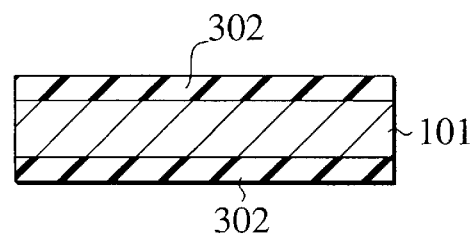
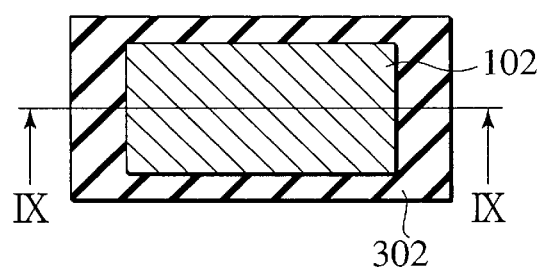
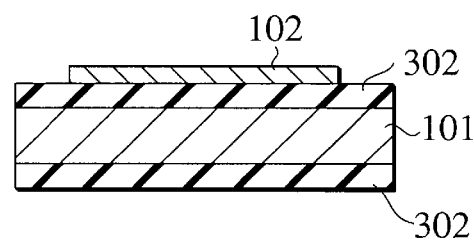
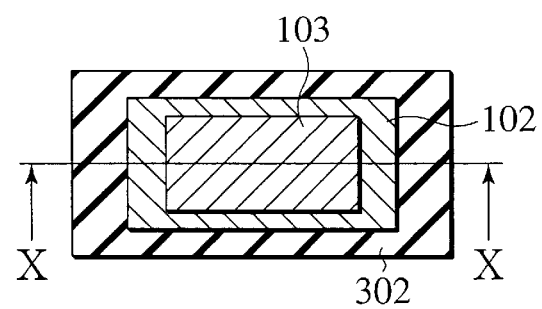
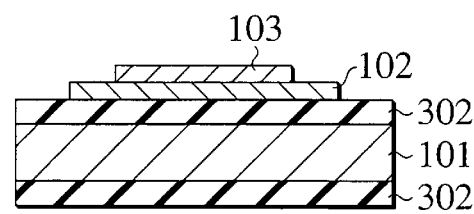

FIG.37A
FIG.37B
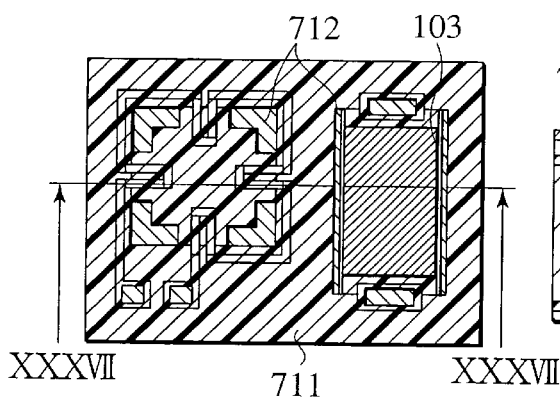
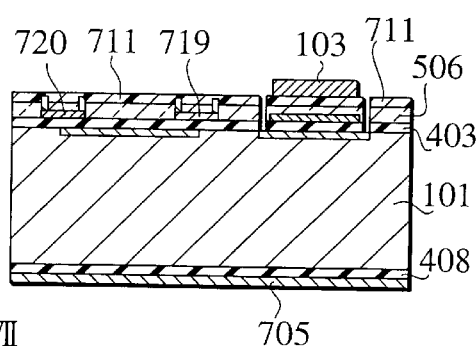
FIG.38A
FIG.38B
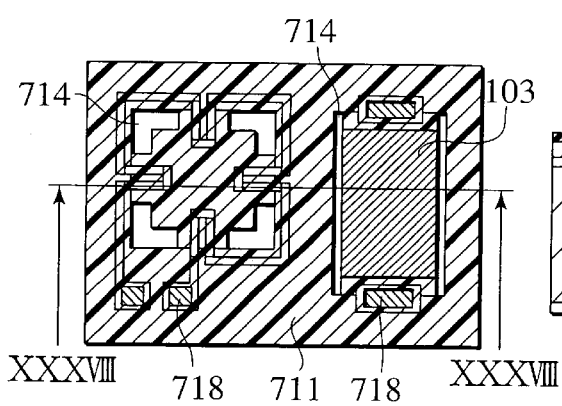
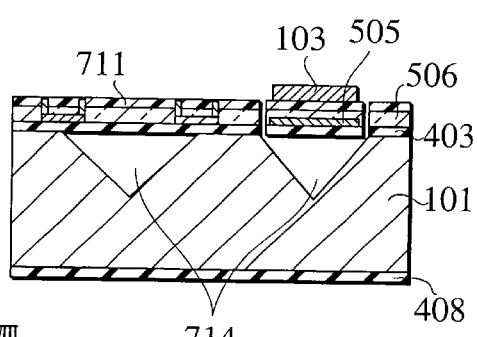
FIG.39A
FIG.39B
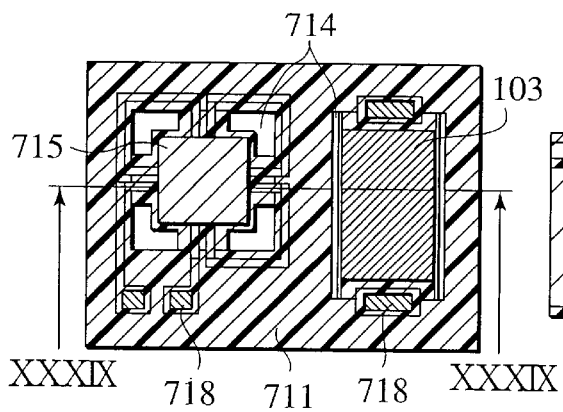
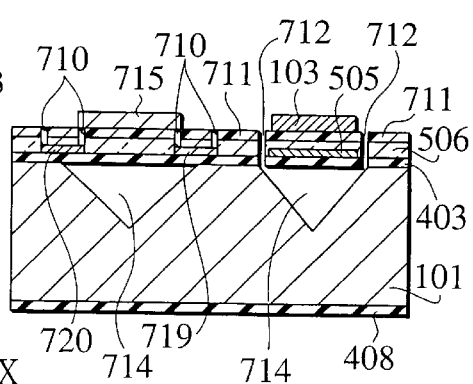

DISK-LIKE GETTERING UNIT, INTEGRATED CIRCUIT, ENCAPSULATED SEMICONDUCTOR DEVICE, AND METHOD FOR MANUFACTURING THE SAME

BACKGROUND OF THE INVENTION

1. Field of the Invention

The present invention pertains to hermetically encapsulated devices such as an encapsulated infrared sensor, an encapsulated angular velocity sensor, and an encapsulated acceleration sensor. Especially, the invention relates to gettering units, which adsorb generated gaseous molecules in enclosed spaces of the encapsulated devices, being encapsulated with active elements such as these sensors in a package, under specific gas ambient or reduced pressure.

2. Description of the Related Art

An earlier gettering unit was implemented in a cylindrical geometry so as to achieve the heater built-in structure. And, there are some devices such as infrared sensors, which should be operated in vacuum environment, encapsulated in a hermetically sealed package. On a same stem, a sensing element, or a sensor chip, and the cylindrical gettering unit are mounted. A cap of the package is hermetically bonded to this stem by projection welding so as to encapsulate the cylindrical gettering unit. And, an infrared window made of germanium (Ge) or silicon (Si), etc. is bonded to the central portion of the cap, disposed at the upper part of the sensing element, with sealing glass. After the inside of the package is vacuum evacuated, a gettering material of the heater built-in gettering unit embedded in the package is activated, and the exhaust tube is sealed off so as to form a vacuum encapsulated package. As the gettering material is chemically active and removes the traces of gas remaining, or adsorbs the gaseous molecules generated in the vacuum after the vacuum encapsulation step completed, the enclosed space of the package is kept to be vacuum state.

To fabricate the heater built-in gettering unit having the cylindrical geometry, a central heater line is prepared. Next, this heater line is covered selectively with an insulating material such as aluminum ($Al_2O_3$) so as to form the cylindrical geometry by electrophoreses, etc, leaving two end terminals of the central heater line as lead wires. Then, the gettering material, in which graphite, etc. is mixed, is pressed so as to forge the cylinder on the insulating material, using top and bottom stamps. The gettering material cylindrically covers in a smaller area than the area that the insulating material surrounds the central heater line. Finally, the baking of this gettering material completes the heater built-in gettering unit.

Next, lead wires of the cylindrical gettering unit are connected with feedthrough lines of a stem by spot welding. The cylindrical gettering unit is installed in the package, by mounting the heater built-in gettering unit on the stem and connecting electrically the heater built-in gettering unit with circuitry disposed outside of the package. Then, a sensing element is mounted on the stem by die bonding. Then, bonding pads of the sensing element and feedthrough lines are electrically connected with bonding wires. Next, the infrared window is connected to the center of the cap by sealing glass. Then, the cap and the stem are bonded together by projection welding. Next, the exhaust tube of the package is connected with a vacuum pump through an exhaust conduit. An AC power supply is connected with the feedthrough lines in order to energize the heater built-in gettering unit. The gettering material is heated by the electric energy and is thermally activated, while the inside of the package is evacuated by the vacuum pump. Finally, the exhaust tube is sealed off so as to assemble the vacuum encapsulated package.

SUMMARY OF THE INVENTION

However, in such cylindrical gettering unit, the gettering material can not be activated uniformly, because the gettering material surrounds the heater line in the shape of the cylinder, and the temperature of the outside portion of the gettering material is lower than the inside portion.

Further, the gettering material of the inside, which is more activated at higher temperature than the outside, cannot sufficiently be submitted to act, since the gettering material of the inside is surrounded by that of the outside with the low activity. Therefore, the amount of gettering material much larger than the necessary and sufficient amount must be used.

An object of the present invention is to provide a gettering unit, which overcome the above-mentioned problems, and can implement uniform activation of the gettering material, and can reduce the quantity of the gettering material to the necessity minimum.

Another object of the present invention is to provide an integrated circuit merging an active element such as a sensor with the gettering unit, making uniform the activation of the gettering material, and reducing the quantity of the gettering material to the necessity minimum.

Still another object of the present invention is to provide an encapsulated semiconductor device mounting an active element such as a sensor with the gettering unit, making uniform the activation of the gettering material, and reducing the quantity of the gettering material to the necessity minimum.

Yet still another object of the present invention is to provide a method for manufacturing the gettering unit, making uniform the activation of the gettering material, and reducing the quantity of the gettering material.

First feature of the present invention inheres in a gettering unit encompassing (a) a substrate having top and bottom surfaces; (b) a thin film heater disposed on the top surface of the substrate; and (c) a gettering layer disposed on the thin film heater.

Second feature of the present invention inheres in a gettering unit encompassing (a) a first conductivity type semiconductor substrate having top and bottom surfaces; (b) a second conductivity type impurity doped region disposed at the top surface and in the single crystal substrate, the impurity doped region serving as a thin film heater, second conductivity type is opposite to the first conductivity type; and (c) a gettering layer disposed on the thin film heater.

Third feature of the present invention inheres in a semiconductor integrated circuit encompassing (a) a single crystal substrate having top and bottom surfaces, the top surface embracing a first area and a second area neighboring to the first area; (b) a thin film heater disposed selectively on the first area; (c) a gettering layer disposed selectively on the thin film heater.; and (d) an active element disposed in the second area.

Fourth feature of the present invention inheres in an encapsulated semiconductor device encompassing (a) a stem having plurality of feedthrough lines; (b) a active element chip mounted on the stem having plurality of bonding pads; (c) an auxiliary chip mounted on the stem, the auxiliary chip having top and bottom surfaces; (d) a thin film heater disposed on the top surface of the auxiliary chip having first and second end terminals; (e) a gettering layer disposed on the thin film heater; (f) a first set of bonding wires connecting between the bonding pads to corresponding feedthrough lines, respectively; (g) a second set of bonding wires connecting between the first and second end terminals to corresponding feedthrough lines, respectively; and (h) a cap bonded to the stem so as to encapsulate the active element chip and the auxiliary chip.

Fifth feature of the present invention inheres in a gettering unit encompassing (a) a thin film gettering means for adsorbing gaseous molecules in an enclosed space; (b) a thin film heating means for heating two dimensionally the gettering means so as to activate uniformly gettering action of the gettering means; (c) a supporting means for supporting the gettering means and heating means; and (d) a thermal isolation means for suppressing heat conduction from the heating means to outer environment.

Sixth feature of the present invention inheres in a method for manufacturing a gettering unit encompassing (a) depositing resistive material on a substrate; (b) delineating the resistive material so as to form a thin film heater; (c) depositing gettering material on the thin film heater; and (d) delineating the gettering material so as to form a gettering layer.

Seventh feature of the present invention inheres in a method for manufacturing a gettering unit encompassing (a) forming a first insulating film on a top surface of a substrate; (b) delineating a thin film heater on the insulating film; (c) forming a second insulating film on the thin film heater; (d) opening contact holes in the second insulating film so as to expose selectively top surface of the thin film heater; (e) forming surface interconnections connected to first and second end terminals of the thin film heater; (f) opening etching windows, by selectively removing the first and second insulating films so as to expose top surface of the substrate; (g) forming a gettering layer on the second insulating film; (h) selectively removing a portion of the substrate just under the gettering layer so as to form a cavity.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

BRIEF DESCRIPTION OF THE DRAWINGS

FIG. 5A is a top view illustrating the manufacturing method of the gettering unit according to the second embodiment of the present invention.

FIG. 5B is a cross-sectional view taken on line V—V of FIG. 5A.

FIG. 6A is a top view illustrating the manufacturing method of the gettering unit according to the second embodiment.

FIG. 6B is a cross-sectional view taken on line VI—VI of FIG. 6A.

FIG. 7A is a top view of the completed gettering unit according to the second embodiment.

FIG. 7B is a cross-sectional view taken on line VII—VII of FIG. 7A.

FIG. 8A is a top view illustrating the manufacturing method of the gettering unit according to the third embodiment of the present invention.

FIG. 8B is a cross-sectional view taken on line VIII—VIII of FIG. 8A.

FIG. 9A is a top view illustrating the manufacturing method of the gettering unit according to the third embodiment.

FIG. 9B is a cross-sectional view taken on line IX—IX of FIG. 9A.

FIG. 10A is the completed top view of the gettering unit according to the third embodiment.

FIG. 10B is a cross-sectional view taken on line X—X of FIG. 10A.

FIG. 37A is a top view illustrating the manufacturing method of the integrated circuit according to the seventh embodiment.

FIG. 37B is a cross-sectional view taken on line XXXVII—XXXVII of FIG. 37A.

FIG. 38A is a top view illustrating the manufacturing method of the integrated circuit according to the seventh embodiment.

FIG. 38B is a cross-sectional view taken on line XXXVIII—XXXVIII of FIG. 38A.

FIG. 39A is a top view of the completed gettering unit and the completed sensing element of the seventh embodiment.

FIG. 39B is a cross-sectional view taken on line XXXIX—XXXIX of FIG. 39A.

DETAILED DESCRIPTION OF THE EMBODIMENTS

Figure 1A:
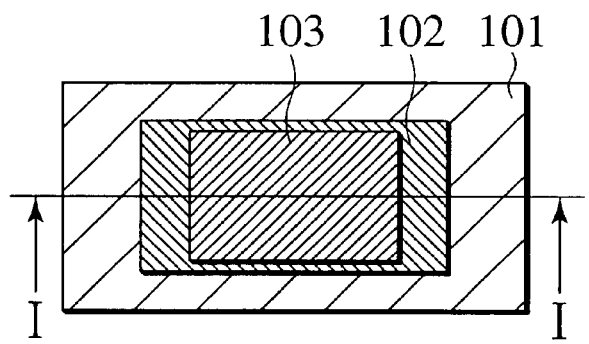
FIG. 1A is a top view of a gettering unit according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is earlier in the representation of semiconductor devices, it will be appreciated that the various drawings are not drawn to scale from one figure to another nor inside a given figure, and in particular that the layer thicknesses are arbitrarily drawn for facilitating the reading of the drawings. In the following description specific details are set fourth, such as specific materials, process and equipment in order to provide thorough understanding of the present invention. It will be apparent, however, to one skilled in the art that the present invention may be practiced without these specific details. In other instances, well-known manufacturing materials, process and equipment are not set fourth in detail in order not unnecessary obscure the present invention.

(First Embodiment)

Figure 1B:
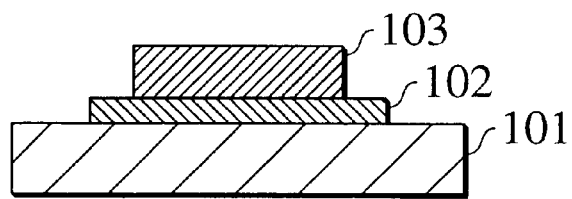
FIG. 1B is a cross-sectional view taken on line I—I of FIG. 1A.

As shown in FIGS. 1A and 1B, a disk-like gettering unit according to the first embodiment encompasses a substrate 101, a thin film heater 102 disposed on the substrate 101, and a gettering layer 103 disposed selectively on the thin film heater 102. The gettering layer 103 serves as "a thin film gettering means" for adsorbing gaseous molecules in an enclosed space. The thin film heater 102 serves as "a thin film heating means" for heating two dimensionally the gettering means 103 so as to activate uniformly gettering action of the gettering means 103. The substrate 101 is "a supporting means" for supporting the gettering means 103 and heating means 102. The substrate 101 may be a semiconductor substrate, such as silicon (Si) substrate. It is also possible to use another substrates such as aluminum substrate or magnesia (MgO) substrate. And, the thin film heater 102 may be made of metallic film such as platinum (Pt) or chromium (Cr) film. The area of the gettering layer 103 is smaller than the area for the thin film heater 102 so as to expose first and second end terminals of the thin film heater 102. The first and second end terminals of the thin film heater 102 serves as the bonding pads in the assembling process to form the vacuum encapsulated package.

In the earlier cylindrical gettering unit, the gettering material cannot be activated uniformly, because the gettering material surrounds the heater line in a cylindrical shape, and the temperature of the outer gettering material is lower than the inner one in the activating process, as mentioned above. In addition, the inner gettering material, activated at higher temperature cannot sufficiently submit to be act, since the outer gettering material, activated at lower temperature, surrounds it. On the other hand, according to the gettering unit of the first embodiment, the gettering layer 103 can be more uniformly thermally activated, because the gettering layer 103 is formed on the thin film heater 102 in a two dimensional geometry. In addition, since the gettering layer 103 is relatively thin, the ratio of the higher activated portion or the higher functional portion can be increased.

Figure 4A:
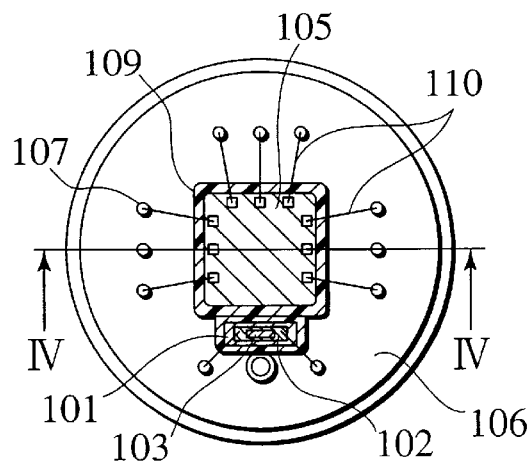
FIG. 4A is a top view illustrating the encapsulated semiconductor device according to the first embodiment.
Figure 4B:
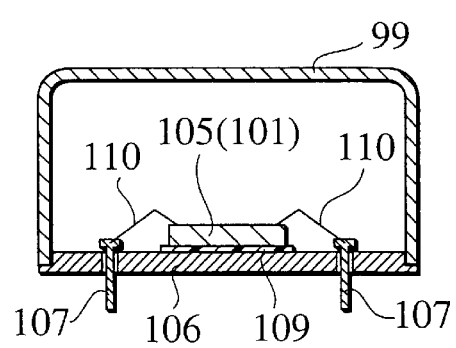
FIG. 4B is a cross-sectional view taken on line IV—IV of FIG. 4A.

FIGS. 4A and 4B show an encapsulated semiconductor device according to the first embodiment. That is, the encapsulated semiconductor device according to the first embodiment encompasses a stem 106 having plurality of feedthrough lines 107, a active element chip 105 mounted on the stem 106, an auxiliary chip 101 mounted on the stem 106 and a cap 99 bonded to said stem 106. The cap 99 encapsulates the active element chip 105 and the auxiliary chip 101. In FIG. 4A, the illustration of the cap 99 is omitted so as to show the detailed structure under the cap. The active element chip 105 has a plurality of bonding pads 111. The auxiliary chip 101 is the substrate 101 of the gettering unit according to the first embodiment. A first set of bonding wires 110 connect between the bonding pads 111 and corresponding feedthrough lines 107, respectively. A second set of bonding wires 110 connect between the first and second end terminals to corresponding feedthrough lines 107, respectively.

The manufacturing method of the encapsulated semiconductor device according to the first embodiment is explained with FIGS. 2A to 4B. And of course, it is also possible to fabricate one gettering unit from one substrate using the substrate having desired size from the beginning, though large number of the gettering unit are fabricated simultaneously on a single substrate 101, and finally, the gettering unit are diced, and large number of the discrete gettering units are obtained, in the followings.

Figure 2A:
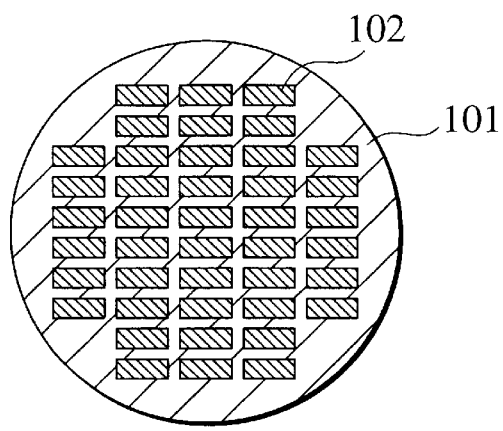
FIG. 2A is a top view illustrating the manufacturing method of the gettering unit according to the first embodiment.

(a) To begin with, the thin film heaters 102 which consist of platinum or chromium are deposited on the substrate 101 by sputtering method or electron beam (EB) vacuum evaporation method. As shown in FIG. 2A, the periodic pattern of the thin film heaters 102 may be delineated by the known lift-off process, or the metallic film is deposited on the window part of desired lift-off mask, and the desired pattern is formed after peeling off the lift-off mask. Or the thin film heater can be delineated by the photolithography process and the etching process after blanket deposition of the metallic film. Here, the material for the thin film heater is not limited to platinum or chromium film, and any material having appropriate electric resistivity can be employed if the temperature of the material increases by conducting current.

Figure 2B:
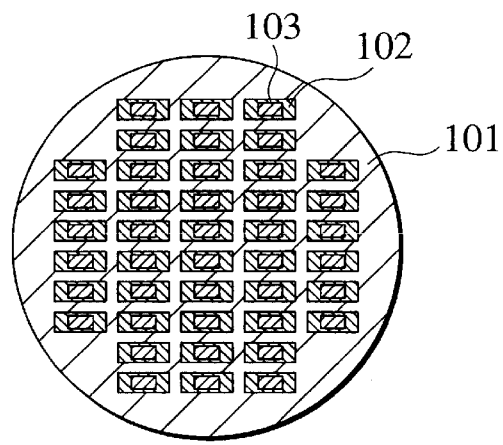
FIG. 2B is a top view illustrating the manufacturing method of the gettering unit according to the first embodiment.

(b) Next, as shown in FIG. 2B, paste-like gettering materials 103 are selectively coated on the thin film heaters 102 by the method such as the screen-printing technique. Afterwards, annealing forms the gettering layers 103. Though the gettering layer 103 is formed by screen-printing technique here, the formation of the gettering layer 103 is possible by the lift-off vacuum evaporation technology. In the lift-off vacuum evaporation technology, the metallic materials having high gettering activities, for example, titanium (Ti), zirconium (Zr), barium (Ba) etc. is deposited on a window part defined by a vacuum evaporation mask by vacuum evaporation technology such as the sputtering method. And, after removing the vacuum evaporation mask, the desired pattern for the gettering layers 103 is delineated. Of course, the desired pattern for the gettering layers 103 may be delineated by the photolithography process and the etching process, after the metallic film is deposited by the sputtering method, etc.

Figure 2C:
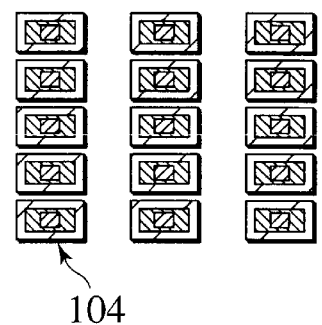
FIG. 2C is a top view of the completed gettering unit according to the first embodiment.

(c) Next, as shown in FIG. 2C, the substrate 101 is diced into the chips by diamond blade, etc., and a plurality of the gettering units 104 are completed.

Figure 3A:
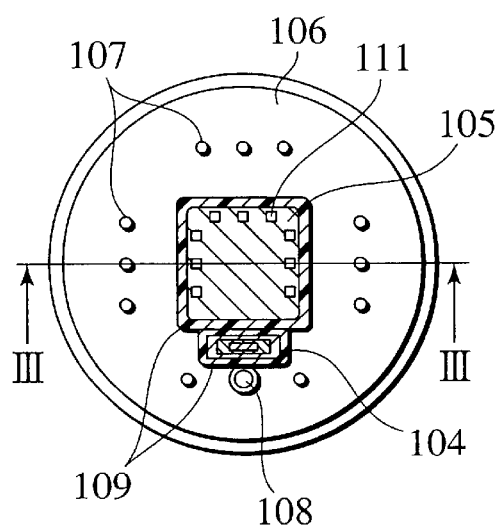
FIG. 3A is a top view illustrating the mounting process of the gettering unit according to the first embodiment.
Figure 3B:
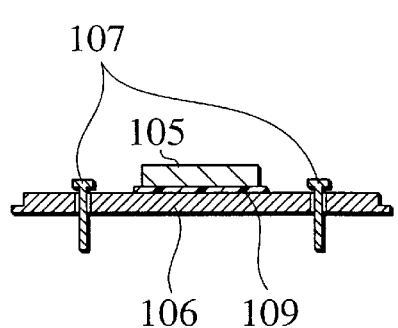
FIG. 3B is a cross-sectional view taken on line III—III of FIG. 3A.

(d) Next, the gettering unit 104 is mounted on a stem 106 with a sensor chip 105 by die bond material 109 as shown in FIGS. 3A and 3B. The stem 106 has feedthrough lines 107 and an exhaust tube 108 for the exhaust. On the perimeter of the sensor chip 105, plurality of bonding pads 111 are arranged.

(e) Finally, as shown in FIGS. 4A and 4B, plurality of bonding pads 111 are connected to corresponding feedthrough lines 107 by bonding wires 110. At the same time first and second end terminals of the thin film heater 102 are connected to corresponding feedthrough lines 107 by the bonding wires 110, respectively. Then, the cap 99 and the stem 106 are hermetically bonded together by, for example, projection welding. Next, the exhaust tube 108 of the package is connected to a vacuum pump. An AC power supply is connected with the feedthrough lines 107 in order to energize the thin film heater 102. The thin film heater 102 heats the gettering layer 103. Finally, the exhaust tube 108 is sealed off so as to complete the vacuum encapsulated package.

According to the manufacturing method for the gettering unit of the first embodiment, it is easy to adjust the area and thickness of the gettering layer 103 only by changing the printing mask, which is relatively low cost, because the pattern of the gettering layer 103 is delineated by the screen-printing technique. That is to say, it is possible to control the quantity of the gettering material precisely, by adjusting only two parameters, or the area and thickness, to optimum values. Therefore, it is possible to use the gettering material of the necessity minimum, without using the superfluous gettering material like the earlier case, in which the gettering material was fabricated by stamping. And, it is easy to change the required quantity for fabricating the gettering unit, by changing the low cost printing mask.

And, the spot welding process must be added to assemble the earlier cylindrical gettering unit in the package. The spot welding process is not usual to the general mounting process. However, the assembling process substantially equal to usual semiconductor chip process is possible in the gettering unit of the first embodiment as shown in FIGS. 3A, 3B, 4A and 4B.

According to the manufacturing method for the gettering unit of the first embodiment, the whole cost of the sensor package is can be lowered, because it is possible to efficiently utilize the gettering material of the necessity minimum, and the assembling process can be simplified for the practical use, since the gettering layer 103 is disposed on the thin film heater 102.

(Second Embodiment)

As shown in FIGS. 7A and 7B, a disk-like gettering unit according to the second embodiment encompasses a substrate 101, a thin film heater 102 disposed on the substrate 101, a buffer layer 203 disposed on the thin film heater 102, and a gettering layer 103 disposed on the buffer layer 203. The substrate 101 may be semiconductor substrate, such as silicon substrate. It is also possible to use another substrates such as aluminum substrate or magnesia substrate. The buffer layer 203 may made of insulating material which does not react with both of the gettering layer 103 and the thin film heater 102 at an elevated temperature for activation of the gettering layer 103. The buffer layer 203 may made of, for example, a silicon oxide ($SiO_2$) film or aluminum ($Al_2O_3$) film. As shown in FIG. 7A, the buffer layer 203 covers wider than the area for the gettering layer 103. The buffer layer 203 does not cover two end terminals of the thin film heater 102. In the gettering unit according to the second embodiment, the thin film heater 102 and the gettering layer 103 are not directly contact each other, which is a different aspect from the gettering unit according to the first embodiment. Other structure and materials are similar to the structure and materials already explained in the first embodiment, and the overlapped description or the redundant description may be omitted in the second embodiment.

In the gettering unit according to the second embodiment, the buffer layer 203, which is inactive with the gettering layer 103 and the thin film heater 102 at the activation temperature for the gettering material, is sandwiched between the thin film heater 102 and the gettering layer 103. Therefore, the gettering layer 103 and the thin film heater 102 can be prevented from reacting with each other so as to cause a failure, in which the desired function can not be achieved, at the elevated temperature for the activation of the gettering material. In addition, the buffer layer 203 can suppresses the leakage current during the activation process, while the leakage current leaks to the gettering layer 103 so that the thin film heater 102 cannot generate scheduled heat.

Next, the manufacturing method of the gettering unit according to the second embodiment is explained with FIGS. 5A to 7B. Though only one gettering unit is shown in these figures, a periodic patterns for gettering units are projected by the step-and-repeat method on a single substrate so as to form a large number of gettering units simultaneously on the substrate, and the substrate is diced to provide the large number of gettering units, substantially similar to the manufacturing method of the gettering unit according to the first embodiment. Or, one gettering unit may be fabricated on a single substrate using the substrate of the desired size.

(a) At first, as shown in FIGS. 5A and 5B, the thin film heater 102 made of platinum or chromium is deposited on a substrate 101 by the sputtering method or EB vacuum evaporation method similar to the first embodiment).

(b) Next, a buffer layer 203 is deposited on the thin film heater 102 by the atmospheric pressure CVD (APCVD) method. As shown in FIGS. 6A and 6B, the pattern for buffer layer 203 may be delineated by the photolithography process and the etching process after the gettering layer is blanket-deposited. Or the lift-off process may delineate the pattern for buffer layer 203.

(c) Next, as shown in FIGS. 7A and 7B, a paste-like gettering material is coated on the buffer layer 203 by the method such as the screen-printing technique. Afterwards, the annealing forms a gettering layer 103.

The assembling process is similar to the process already explained in the first embodiment, and the overlapped description or the redundant description may be omitted in the second embodiment. According to the manufacturing method for the gettering unit of the second embodiment, the all-embracing process simplification from the manufacturing to the assembling process of the gettering unit can be achieved, and the reduction of the manufacturing cost become possible.

(Third Embodiment)

As shown in FIGS. 10A and 10B, a disk-like gettering unit according to the third embodiment encompasses a substrate 101, a top thermally insulating layer 302 disposed on the top surface of the substrate 101, a bottom thermally insulating layer 302 disposed on the bottom surface of the substrate 101, a thin film heater 102 disposed on the top thermally insulating layer 302, and a gettering layer 103 disposed on the thin film heater 102. The substrate 101 may be semiconductor substrate, such as silicon substrate. It is also possible to use another substrates such as aluminum substrate or magnesia substrate.

Thermal conductivity of the top and bottom thermally insulating layers 302 is lower than that of the substrate 101. As an example of the top and bottom thermally insulating layers 302, the silicon oxide (SiO$_2$) film can be employed. However, any low thermal conductivity materials other than the silicon oxide film can also be employed, as long as the layer has lower thermal conductivity than that of the than substrate 101, and it does not react with the thin film heater 102 at the elevated temperature for activating the gettering layer 103. The structure that the top thermally insulating layer 302 is sandwiched between the thin film heater 102 and the substrate 101 is the principal different aspect from the structure of the first embodiment. Other structure and materials are similar to the structure and materials already explained in the first embodiment, and the overlapped description or the redundant description might be omitted in the third embodiment.

In the gettering unit according to the third embodiment, the top thermally insulating layer 302 is sandwiched between the silicon substrate 301 and the thin film heater 102. The gettering layer 103 is efficiently activated with smaller electric power than the first embodiment, because the top thermally insulating layer 302 prevents that the heat generated in the thin film heater 102 escapes to the substrate 101.

Next, the manufacturing method for the gettering unit according to the third embodiment is explained with FIGS. 8A to 10B. Though only one gettering unit is shown in these figures, an array of gettering units can be fabricated simultaneously on a single substrate, and then diced to a large number of gettering units, similar to the first embodiment. And, one gettering unit may be fabricated on a single substrate of the desired size.

(a) At first, as shown in FIGS. 8A and 8B, thermal silicon oxide (SiO$_2$) films 302 are formed on the top and bottom surfaces of the substrate 101 by annealing the substrate 101 in the oxidation ambient.

(b) Next, the thin film heater 102 made of platinum or chromium is deposited on the top silicon oxide film 302 by the sputtering method or the EB vacuum evaporation method similar to the first embodiment. As shown in FIGS. 9A and 9B, the pattern of the thin film heater 102 is delineated by the lift-off process or by the photolithography process and the etching process.

(c) Next, a paste-like gettering material is coated on the thin film heater 102 by the method such as the screen-printing technique, and the gettering layer 103 is formed by annealing as shown in FIGS. 10A and 10B. Here, the gettering layer 103 is formed smaller than the area of the thin film heater 102 as it is shown in FIG. 10A.

The assembling process is similar to the process already explained in the first embodiment, and the overlapped description or the redundant description may be omitted in the third embodiment. According to the manufacturing method for the gettering unit of the third embodiment, the all-embracing process simplification from the manufacturing to the assembling process of the gettering unit can be achieved, and the reduction of the manufacturing cost become possible.

(Fourth Embodiment)

Figure 16A:
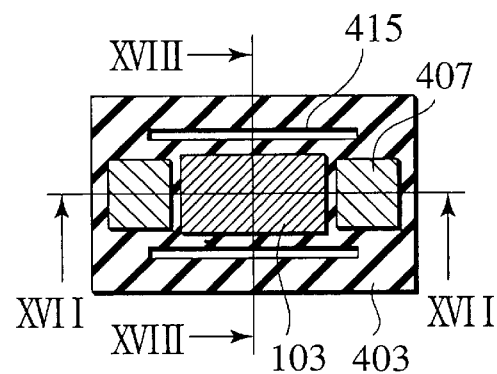
FIG. 16A is a top view of the completed gettering unit according to the fourth embodiment.
Figure 16B:
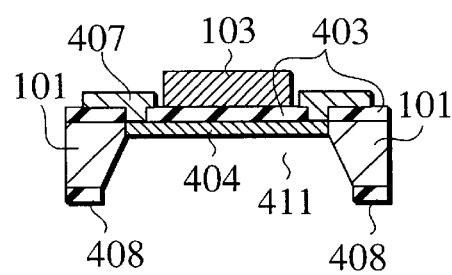
FIG. 16B is a cross-sectional view taken on line XVI I—XVI I of FIG. 16A.
Figure 16C:
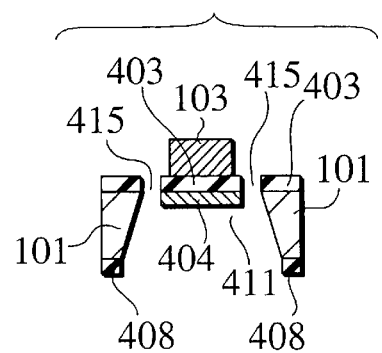
FIG. 16C is a cross-sectional view taken on line XVI II—XVI II of FIG. 16A.

As shown in FIGS. 16A to 16C, a disk-like gettering unit according to the fourth embodiment encompasses a first conductivity type semiconductor substrate 101 having a groove at the bottom surface so as to form a hollow space 411, a thin film heater 404 disposed at the top surface and in the semiconductor substrate 101, a top insulating film 403 disposed on the top surface of the semiconductor substrate 101, a bottom insulating film 408 disposed on the bottom surface of the semiconductor substrate 101, and a gettering layer 103 disposed on the top insulating film 403. The top and bottom insulating films 403 and 408 may be a silicon oxide (SiO$_2$) film, a phosphosilicate glass (PSG), a borophosphosilicate glass (BPSG), or a silicon nitride (Si$_3$N$_4$) film 403. The combination of these insulating materials is also employable. Hereinafter, we employ the silicon oxide film as the silicon oxide (SiO$_2$) films. The gettering layer 103 serves as a thin film gettering means for adsorbing gaseous molecules in an enclosed space of a package. The thin film heater 404 serves as a thin film heating means for heating two dimensionally the gettering means 103 so as to activate uniformly gettering action of the gettering means 103. The semiconductor substrate 101 is a supporting means for supporting the gettering means 103 and heating means 102. The hollow space 411 serves as a part of "a thermal isolation means" for suppressing heat conduction from the heating means 404 to outer environment. The semiconductor substrate 101 should be a single crystal substrate 101, because it is convenient to execute the orientation dependent etching to define the hollow space 411.

The crystallographic plane, or the Miller indices of the top and bottom surfaces of the single crystal substrate 101 is selected to be (100). In the gettering unit according to the fourth embodiment, the structure that the bottom surface of the thin film heater 404 is directly neighboring to the hollow space 411 so that the thin film heater 404 is thermally isolated from the outer environment by the existence of the hollow space 411 is the paramount different aspect from the third embodiment. Furthermore, the aspect that the thin film heater 404 is made of impurity-doped region of semiconductor is different from the third embodiment. In the thin film heater 404, a second conductivity type impurities opposite to the first conductivity type are heavily doped, for example, at the concentration of $2 \times 10^{18}$ cm$^{-3}$ to $1 \times 10^{20}$ cm$^{-3}$. If we select n-type as the first conductivity type, the second conductivity type is p-type, and vice versa. The thin film heater 404 implements the diaphragm configuration. The thin film heater 404 has first and second end terminals. And surface interconnections (or the metallic electrodes) 407 contact with the first and second end terminals through contact holes opened in the top insulating film 403. The two surface interconnections 407, electrically connected to the thin film heater 404, serve as the bonding pads in the assembling process to form the vacuum encapsulated package.

As shown in FIGS. 16A and 16C, at the top surface side of the single crystal substrate 101, a couple of the isolation slits 415 are formed so as to thermally isolate the thin film heater 404 from the neighboring portion of the single crystal substrate 101. The isolation slits 415 serve as another parts of the thermal isolation means for suppressing heat conduction from the heating means 404 to outer environment. FIG. 16A shows the upper isolation slit (a first isolation slit) 415 and lower isolation slit (a second isolation slit) 415 running parallel to the upper isolation slit 415. The upper and lower isolation slits 415 define the area for the thin film heater 404. Other structure and materials are similar to the structure and materials already explained in the third embodiment, and the overlapped description or the redundant description might be omitted in the fourth embodiment.

In the gettering unit according to the fourth embodiment, the thin film heater 404, made of the semiconductor diffusion layer, is thermally isolated from the single crystal substrate 101 by the hollow space 411 and a couple of the isolation slits 415. The thickness of the thin film heater 404 can be controlled to have a very thin value by thermal diffusion technique so that heat capacity of the thin film heater is made to be very small, and the heat does not easily escape to the environment, except for the bridging part by which the thin film heater 404 is connected to the neighboring semiconductor regions of the substrate 101, if the thin film heater 404 is vacuum encapsulated. Therefore, the heating efficiency of the gettering layer 103 becomes higher than that of the gettering unit according to the third embodiment.

The manufacturing method of the gettering unit according to the fourth embodiment is explained with FIGS. 11A to 16C. Though only one gettering unit is shown in these figures, a large number of the gettering units are fabricated simultaneously on a single substrate and are divided finally to provide discrete gettering units, similar to the first embodiment. And, one gettering unit may be fabricated from one substrate using the substrate of the desired size. In the followings, the method for delineating the resist film and miscellaneous thin films shall be construed as conducted by "the photolithography process and the necessary etching process", as long as there is no specific description of the patterning. In the fourth embodiment, a single crystal silicon substrate 101 having the top and bottom surface of (100) plane is employed for the semiconductor substrate 101.

Figure 11A:
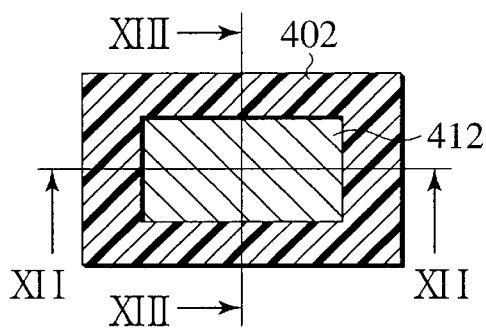
FIG. 11A is a top view illustrating the manufacturing method of the gettering unit according to the fourth embodiment of the present invention.
Figure 11B:
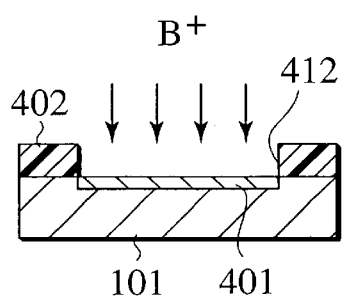
FIG. 11B is a cross-sectional view taken on line XII—XII of FIG. 11A.
Figure 11C:
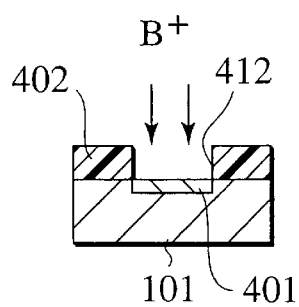
FIG. 11C is a cross-sectional view taken on line XIII—XIII of FIG. 11A.

(a) At first, a resist film 402 is spin-coated on an n-type (a first conductivity type) silicon substrate 101 having the top and bottom surface of (100) plane. And the resist film 402 is delineated to form an ion-implantation mask having windows 412 for introducing impurity ions selectively at the top surface of the silicon substrate 101. Then, using the resist pattern 402 as the ion-implantation mask, p-type (a second conductivity type) impurity ions such as boron ions ($^{11}B^+$) are implanted through the window 412 as shown in FIGS. 11A, 11B and 11C. If the silicon substrate 101 is p-type, n-type impurity ions such as phosphorus ions ($^{31}P^+$) or arsenic ions ($^{75}As^+$) can be implanted through the window 412.

Figure 12A:
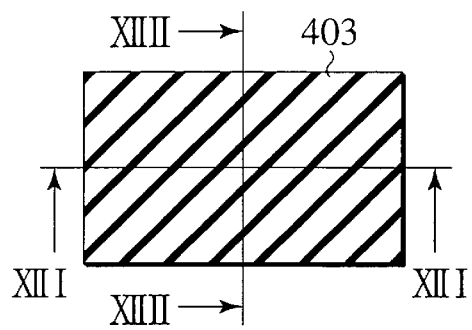
FIG. 12A is a top view illustrating the manufacturing method of the gettering unit according to the fourth embodiment.
Figure 12B:
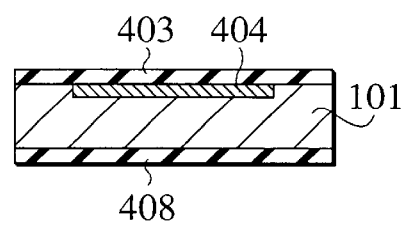
FIG. 12B is a cross-sectional view taken on line XII I—XII I of FIG. 12A.
Figure 12C:
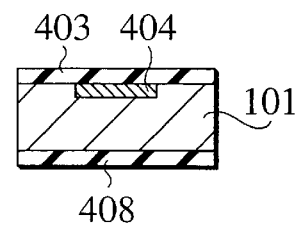
FIG. 12C is a cross-sectional view taken on line XII II—XII II of FIG. 12A.

(b) Next, the n-type silicon substrate 101 is annealed in an oxidation ambient so that the top thermal silicon oxide film 403 is formed on the top surface of the substrate 101 and the bottom thermal silicon oxide film 408 is formed on the bottom surface of the substrate 101. And, simultaneously, the implanted boron ions are activated so as to form a p-type impurity doped region (the p-type diffusion layer), which serves as the thin film heater 404 as shown in FIGS. 12A, 12B and 12C.

Figure 13A:
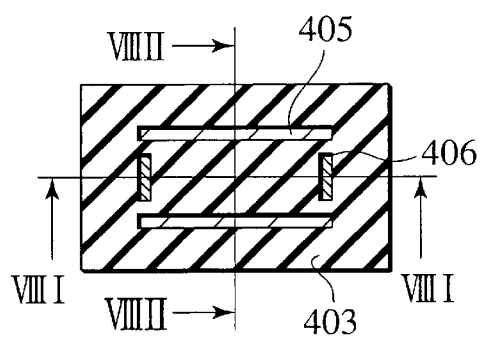
FIG. 13A is a top view illustrating the manufacturing method of the gettering unit according to the fourth embodiment.
Figure 13B:
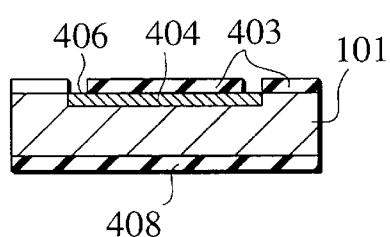
FIG. 13B is a cross-sectional view taken on line XIII I—XIII I of FIG. 13A.
Figure 13C:
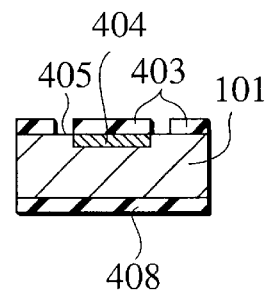
FIG. 13C is a cross-sectional view taken on line XIII II—XIII II of FIG. 13A.

(c) Next, by selectively etching the top silicon oxide film 403, a couple of straight slit-like etching windows 405 for forming isolation slits, which will separate the thin film heater 404 from the neighboring portion of the silicon substrate 101, and a couple of contact holes 406 for connecting surface interconnections to the first and second end terminals of the thin film heater 404 are opened as shown in FIGS. 13A, 13B and 13C.

Figure 14A:
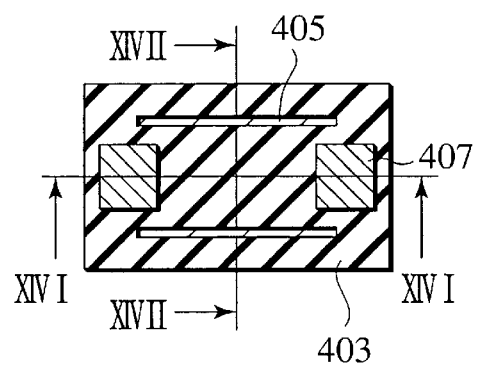
FIG. 14A is a top view illustrating the manufacturing method of the gettering unit according to the fourth embodiment.
Figure 14B:
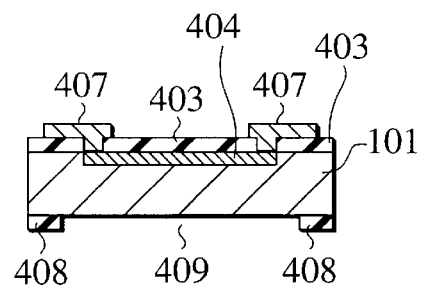
FIG. 14B is a cross-sectional view taken on line XIV I—XIV I of FIG. 14A.
Figure 14C:
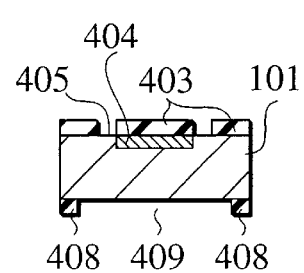
FIG. 14C is a cross-sectional view taken on line XIV II—XIV II of FIG. 14A.

(d) Next, the metallic film such as aluminum (Al) and aluminum alloys (Al—Si, Al—Cu—Si) is deposited by the sputtering method or the EB evaporation method, etc., on the top silicon oxide film 403. And surface interconnections (or the metallic electrodes) 407 for supplying the electricity to the thin film heater 404 are delineated so as to contact with the first and second end terminals of the thin film heater 404 as shown in FIGS. 14A to 14C. In addition, the bottom silicon oxide film 408 at the back surface of the silicon substrate 101 is selectively etched so as to form a silicon-etching window 409 as shown in FIGS. 14B and 14C.

Figure 15A:
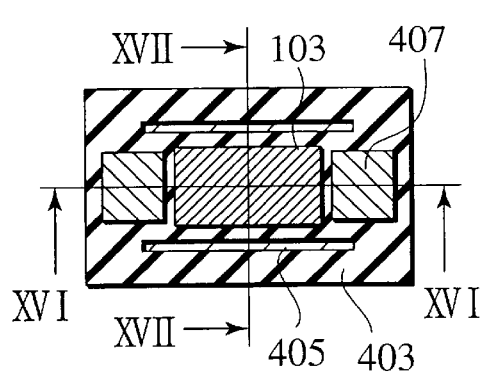
FIG. 15A is a top view illustrating the manufacturing method of the gettering unit according to the fourth embodiment.
Figure 15B:
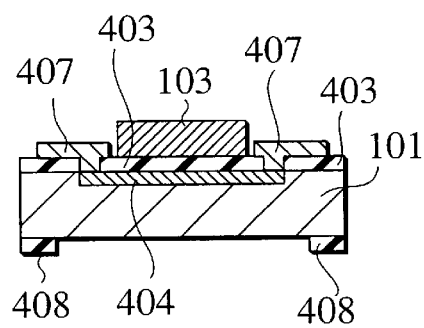
FIG. 15B is a cross-sectional view taken on line XV I—XV I of FIG. 15A.
Figure 15C:
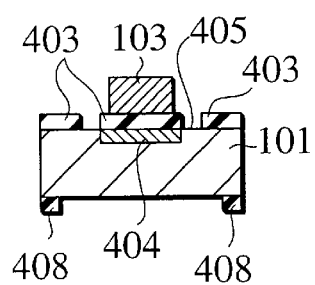
FIG. 15C is a cross-sectional view taken on line XV II—XV II of FIG. 15A.

(e) Next, as shown in FIGS. 15A, 15B, and 15C, a paste-like gettering material 103 is selectively coated on the top silicon oxide film 403 by the method such as the screen-printing technique. Afterwards, annealing forms the gettering layer 103.

(f) Next, the bottom side of the silicon substrate 101 is etched through the silicon-etching window 409 by the known anisotropic silicon etchant such as the hydrazine ($N_2H_4$) solution so as to form a groove, or the hollow space 411. Since etching rate for (111) plane by the hydrazine solution is lower than (100) plane, the (111) planes appear at the sidewalls of the groove 411. Since the orientation-dependent etching by the hydrazine solution is also concentration-dependant etching, the etch front automatically terminates at the interface of the thin film heater 404, since boron is heavily doped in the thin film heater 404. Simultaneously, the top surface side of the silicon substrate 101 is etched through the silicon-etching window 405 by the anisotropic silicon etchant so as to form a couple of the isolation slits 415. Thus, the thin film heater 404 implements the diaphragm configuration.

The assembling process is similar to the process already explained in the first embodiment, and the overlapped description or the redundant description may be omitted in the fourth embodiment. According to the manufacturing method for the gettering unit of the fourth embodiment, the all-embracing process simplification from the manufacturing to the assembling process of the gettering unit can be achieved, and the reduction of the manufacturing cost become possible.

(Fifth Embodiment)

Figure 23A:
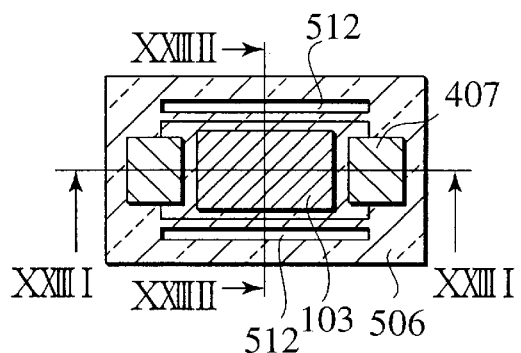
FIG. 23A is a top view of the completed gettering unit according to the fifth embodiment.
Figure 23B:
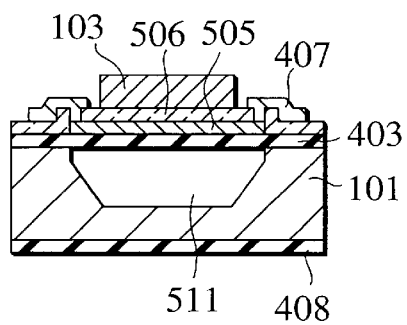
FIG. 23B is a cross-sectional view taken on line XXIII I—XXIII I of FIG. 23A.
Figure 23C:
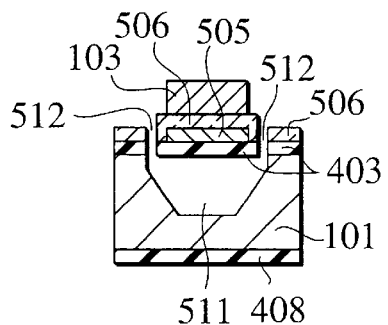
FIG. 23C is a cross-sectional view taken on line XXIII II—XXIII II of FIG. 23A.

As shown in FIGS. 23A to 23C, a disk-like gettering unit according to the fifth embodiment encompasses a single crystal substrate 101 having a groove dug from the top surface so as to form a limited hollow space (or the cavity) 511, a top insulating film 403, disposed on the top surface of the substrate 101 so as to include the cavity 511, a bottom insulating film 408 disposed on the bottom surface of the substrate 101, a thin film heater 505 disposed on the top insulating film 403, a thermally insulating layer 506 disposed on the thin film heater 505 and a gettering layer 103 disposed on the thermally insulating layer 506. The top and bottom insulating films 403 and 408 may be a silicon oxide ($SiO_2$) film, for example. The gettering layer 103 serves as a thin film gettering means for adsorbing gaseous molecules in an enclosed space of a package. The thin film heater 505 serves as a thin film heating means for heating two dimensionally the gettering means 103 so as to activate uniformly gettering action of the gettering means 103. The semiconductor substrate 101 is a supporting means for supporting the gettering means 103 and heating means 505. The hollow space 511 serves as a part of a thermal isolation means for suppressing heat conduction from the heating means 505 to outer environment.

The same crystallographic plane, or the Miller indices of the top and bottom surfaces of the single crystal substrate 101 is selected as the fourth embodiment, or the (100) orientation is selected. In the gettering unit according to the fifth embodiment, the groove dug from the top surface of the single crystal substrate 101 so as to form the limited hollow space 511 is the paramount different aspect from the fourth embodiment. And similar but different structure that the bottom surface of the thin film heater 505 is neighboring to the limited hollow space 511 through the top silicon oxide film 403 so that the thin film heater 505 is thermally isolated by the limited hollow space 511 is employed. Furthermore, the aspect that the thin film heater 505 is made of doped polysilicon film is different from the fourth embodiment. In the thin film heater 505, either the first conductivity type or a second conductivity type impurity opposite to the first conductivity type impurity can be doped. The thin film heater 505 implements the diaphragm configuration supported by the top silicon oxide film 403. The thin film heater 505 has first and second end terminals. And surface interconnections (or the metallic electrodes) 407 contact with the first and second end terminals through contact holes opened in the thermally insulating layer 506. The two surface interconnections 407, electrically connected to the thin film heater 505, serve as the bonding pads in the assembling process to form the vacuum encapsulated package.

As shown in FIGS. 23A and 23C, at the top surface side of the single crystal substrate 101, a couple of the isolation slits 512 are formed so as to suppress the heat flow from the thin film heater 505 to the neighboring portion of the single crystal substrate 101. The isolation slits 415 serve as another parts of the thermal isolation means for suppressing heat conduction from the heating means 404 to outer environment. FIG. 23A shows the upper isolation slit (a first isolation slit) 512 and lower isolation slit (a second isolation slit) 512 running parallel to the upper isolation slit 512. The upper and lower isolation slits 512 define the base area for mounting the thin film heater 505. Other structure and materials are similar to the structure and materials already explained in the fourth embodiment, and the overlapped description or the redundant description might be omitted in the fifth embodiment.

In the gettering unit according to the fifth embodiment, the mechanical strength is high because there is no isolation slits 415 (See FIG. 16C) which penetrates the single crystal substrate 101. Then the handling of the gettering unit becomes easy compared with the gettering unit according to the fourth embodiment.

The manufacturing method of the gettering unit according to the fifth embodiment is explained with FIGS. 17A to 23C. Though only one gettering unit is shown in these figures, a large number of the gettering units are fabricated simultaneously on a single substrate and are divided finally to provide discrete gettering units, similar to the first embodiment. And, one gettering unit may be fabricated from one substrate using the substrate of the desired size. In the fifth embodiment, a silicon substrate 101 having the top and bottom surface of (100) plane is employed for the single crystal substrate 101.

Figure 17A:
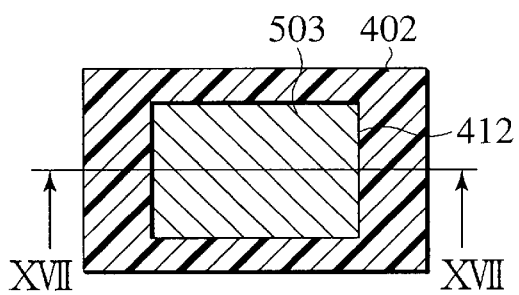
FIG. 17A is a top view illustrating the manufacturing method of the gettering unit according to the fifth embodiment of the present invention.
Figure 17B:
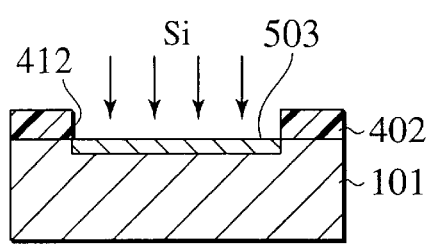
FIG. 17B is a cross-sectional view taken on line XVII—XVII of FIG. 17A.

(a) At first, a resist film 402 is spin-coated on the top surface of the (100) oriented single crystal substrate 101. And a resist pattern 402 serving as an ion-implantation mask, having a window 412 at a portion scheduled for forming the cavity (limited hollow space) 511, is delineated. With the ion-implantation mask 402, silicon ions ($^{28}Si^+$) are implanted through the window 412 as shown in FIGS. 17A and 17B so as to generate a damaged layer 503.

Figure 18A:
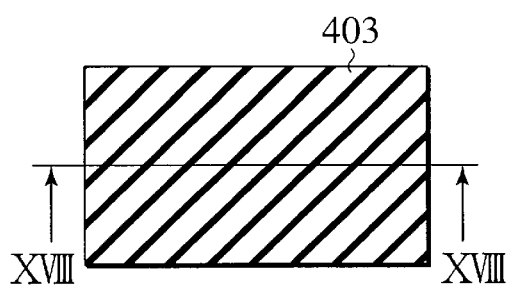
FIG. 18A is a top view illustrating the manufacturing method of the gettering unit according to the fifth embodiment.
Figure 18B:
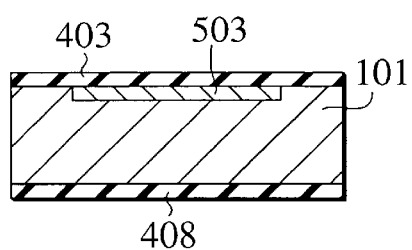
FIG. 18B is a cross-sectional view taken on line XVIII—XVIII of FIG. 18A.

(b) Next, the single crystal substrate 101 is annealed in an oxidation ambient so that the top thermal silicon oxide film 403 is formed on the top surface of the substrate 101 and the bottom thermal silicon oxide film 408 is formed on the bottom surface of the substrate 101 as shown in FIGS. 18A and 18B.

Figure 19A:
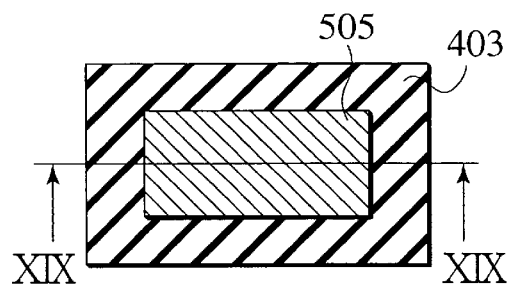
FIG. 19A is a top view illustrating the manufacturing method of the gettering unit according to the fifth embodiment.
Figure 19B:
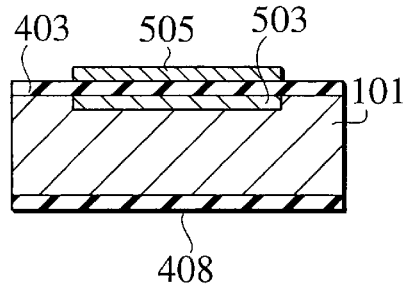
FIG. 19B is a cross-sectional view taken on line XIX—XIX of FIG. 19A.

(c) Next, a polysilicon film is deposited on the top thermal silicon oxide film 403 by methods such as the LP-CVD method. And, impurities such as phosphorus or boron are doped in the polysilicon film by methods such as the ion implantation and thermal diffusion method so as to form a doped polysilicon film. Then, the doped polysilicon film is delineated so as to form the thin film heater (or the polysilicon resistance) 505 on the top thermal silicon oxide film 403 as shown in FIGS. 19A and 19B.

Figure 20A:
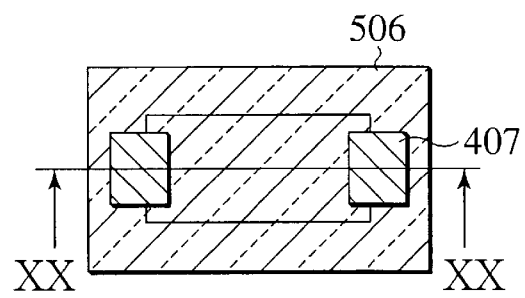
FIG. 20A is a top view illustrating the manufacturing method of the gettering unit according to the fifth embodiment.
Figure 20B:
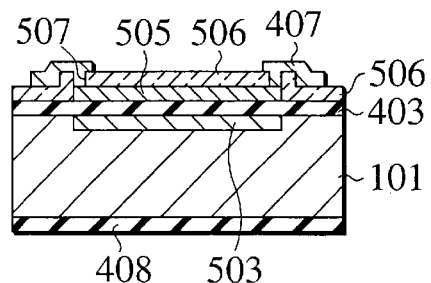
FIG. 20B is a cross-sectional view taken on line XX—XX of FIG. 20A.

(d) Next, a phosphosilicate glass (PSG) film 506 is deposited on the thin film heater 505 by methods such as the APCVD method. And, contact holes 507 for connecting surface interconnections 407 to end terminals of the thin film heater 505 are opened in the PSG film 506. Next, a metallic film such as an Al film and Al—Si film is deposited by the sputtering method or the EB evaporation method, etc. Afterwards, the metallic film is delineated so as to form the surface interconnections 407 as shown in FIGS. 20A and 20B.

Figure 21A:
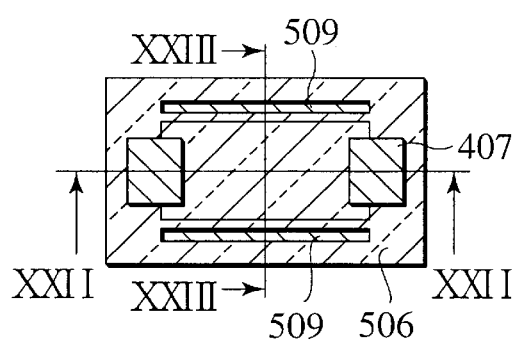
FIG. 21A is a top view illustrating the manufacturing method of the gettering unit according to the fifth embodiment.
Figure 21C:
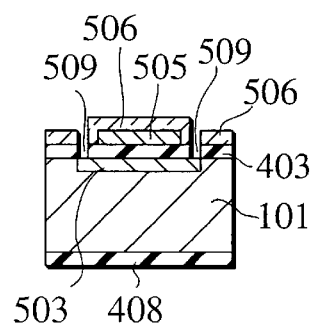
FIG. 21C is a cross-sectional view taken on line XXI II—XXI II of FIG. 21A.

(e) Next, a couple of straight slit-like etching windows 509 for silicon etching are opened, selectively removing the PSG film 506 and the top thermal silicon oxide film 403 so as to expose the top surface of the damaged layer 503 as shown in FIGS. 21A and 21C.

Figure 22A:
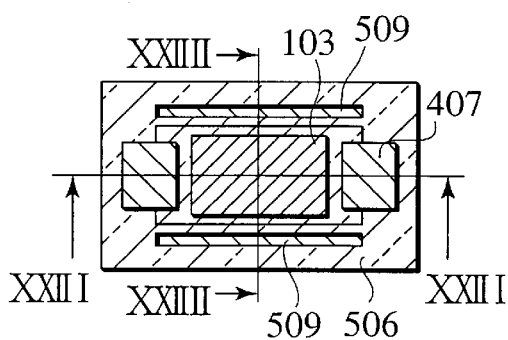
FIG. 22A is a top view illustrating the manufacturing method of the gettering unit according to the fifth embodiment.
Figure 21B:
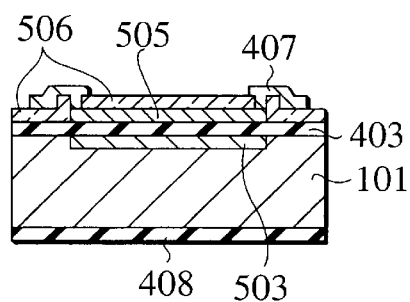
FIG. 21B is a cross-sectional view taken on line XXI I—XXI I of FIG. 21A.
Figure 22B:
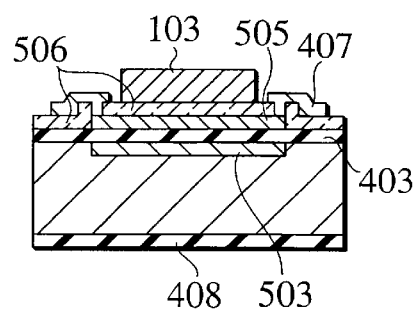
FIG. 22B is a cross-sectional view taken on line XXII I—XXII I of FIG. 22A.
Figure 22C:
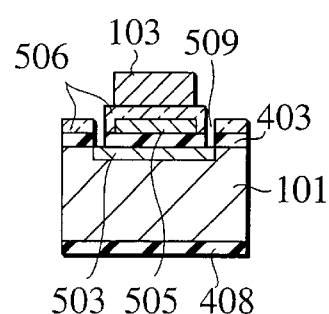
FIG. 22C is a cross-sectional view taken on line XXII II—XXII II of FIG. 22A.

(f) Next, a gettering layer 103 is selectively coated on the PSG film 506 by the methods such as the screen-printing technique as shown in FIGS. 22A, 22B, and 22C.

(g) Next, the damaged layer 503, having higher etching rate, are selectively removed so as to form a thin hollow space through the straight slit-like etching windows 509, employing the anisotropic silicon etching solution such as the hydrazine. Then, as shown in FIGS. 23A and 23C, at the top surface side of the single crystal substrate 101, a couple of the isolation slits 512 are formed. FIG. 23A shows the upper isolation slit (a first isolation slit) 512 and lower isolation slit (a second isolation slit) 512 running parallel to the upper isolation slit 512. Further, as shown in FIGS. 23A, 23B and 23C, the single crystal substrate 101 under the thin film heater 505 are also removed so as to form the limited hollow space (or the cavity) 511, providing the anisotropic silicon etching solution through the straight slit-like etching windows 509, the isolation slits 512 and the thin hollow space. Since etching rate for (111) plane by the hydrazine solution is lower than (100) plane, the (111) planes appear at the sidewalls of the cavity 511. Then the thin film heater 505 is thermally isolated.

The assembling process is similar to the process already explained in the first embodiment, and the overlapped description or the redundant description may be omitted in the fifth embodiment. In the manufacturing method for the gettering unit according to the fifth embodiment, since the silicon-etching windows 509 are arranged at the top surface of the single crystal substrate 101, the photolithography process at the back surface of the single crystal substrate 101 is not required, contrary to the fifth embodiment. Then, exclusive photolithography equipment for the back surface alignment becomes unnecessary.

(Sixth Embodiment)

Figure 30A:
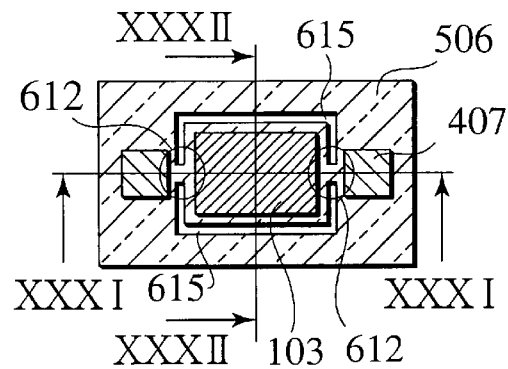
FIG. 30A is a top view of the completed gettering unit according to the sixth embodiment
Figure 30B:
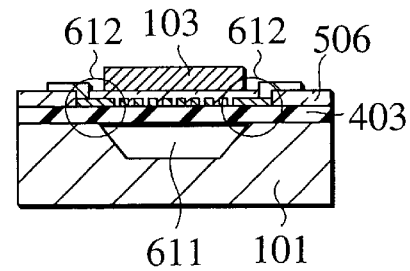
FIG. 30B is a cross-sectional view taken on line XXX I—XXX I of FIG. 30A.
Figure 30C:
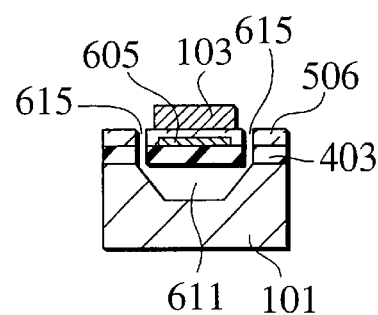
FIG. 30C is a cross-sectional view taken on line XXX II—XXX II of FIG. 30A.

As shown in FIGS. 30A to 30C, a disk-like gettering unit according to the sixth embodiment encompasses a single crystal substrate 101 having a groove dug from the top surface so as to form a limited hollow space (or the cavity) 611, a top insulating film 403 disposed on the top surface of the substrate 101 so as to include the cavity 611, a bottom insulating film 408 disposed on the bottom surface of the substrate 101, a meandering thin film heater 605 disposed on the top insulating film 403, a thermally insulating layer 506 disposed on the meandering thin film heater 605 and a gettering layer 103 disposed on the thermally insulating layer 506. The top and bottom insulating films 403 and 408 may be a silicon oxide (SiO$_2$) film, for example. The gettering layer 103 serves as a thin film gettering means for adsorbing gaseous molecules in an enclosed space of a package. The thin film heater 605 serves as a thin film heating means for heating two dimensionally the gettering means 103 so as to activate uniformly gettering action of the gettering means 103. The semiconductor substrate 101 is a supporting means for supporting the gettering means 103 and heating means 605. The cavity 611 serves as a part of a thermal isolation means for suppressing heat conduction from the heating means 605 to outer environment.

Figure 26A:
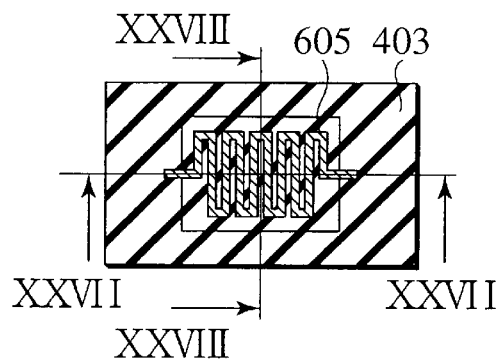
FIG. 26A is a top view illustrating the manufacturing method of the gettering unit according to the sixth embodiment.
Figure 28A:
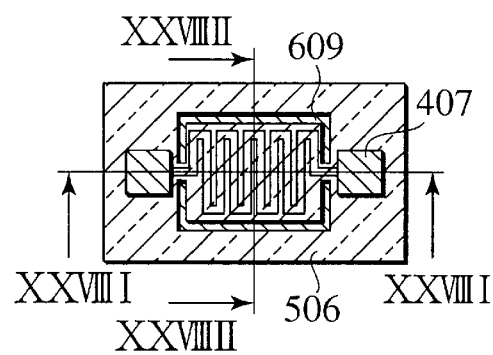
FIG. 28A is a top view illustrating the manufacturing method of the gettering unit according to the sixth embodiment.
Figure 29A:
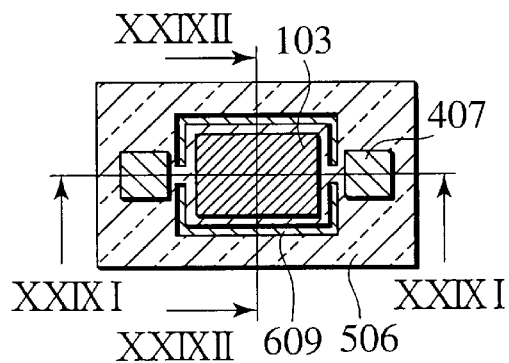
FIG. 29A is a top view illustrating the manufacturing method of the gettering unit according to the sixth embodiment.

In the gettering unit according to the sixth embodiment, the zigzag shape of the meandering thin film heater 605 made of doped-polysilicon film as shown in FIG. 26A is the different aspect from the fifth embodiment. The thin film heater 605 has first and second end terminals. And surface interconnections (or the metallic electrodes) 407 contact with the first and second end terminals through contact holes opened in the thermally insulating layer 506. The two surface interconnections 407, electrically connected to the thin film heater 605, serve as the bonding pads in the assembling process to form the vacuum encapsulated package. And, the straight slit-like shape of the isolation slits 512 of the fifth embodiment is changed to "concave polygonal" isolation slits 615 having narrow width as shown in FIGS. 28A, 29A and 30A. The isolation slits 615 serve as another parts of the thermal isolation means for suppressing heat conduction from the heating means 605 to outer environment. Each of the concave polygons has rectangular angles so as to form "C-shape". The upper and lower concave polygonal isolation slits 615 facing each other in mirror symmetry so as to include the meandering thin film heater 605 and the gettering layer 103 between them. The left and right narrow spaces, assigned by two circles in FIGS. 30A and 30B, form two thin beams 612 sandwiched by the ends of the upper and lower concave polygonal isolation slits 615. Therefore, the thermal isolation of the meandering thin film heater 605 becomes more effective than the thin film heater 505 of the fifth embodiment. Other structure and materials are similar to the structure and materials already explained in the fifth embodiment, and the overlapped description or the redundant description might be omitted in the sixth embodiment.

The manufacturing method of the gettering unit according to the sixth embodiment, which is substantially same as that of the fifth embodiment, will be explained with FIGS. 24A to 30C. In the sixth embodiment, a silicon substrate 101 having the top and bottom surface of (100) plane is employed for the single crystal substrate 101.

Figure 24A:
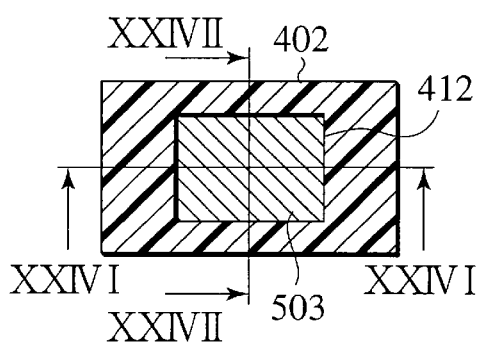
FIG. 24A is a top view illustrating the manufacturing method of the gettering unit according to the sixth embodiment of the present invention.
Figure 24B:
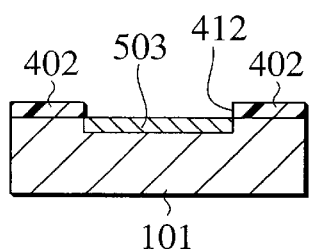
FIG. 24B is a cross-sectional view taken on line XXIV I—XXIV I of FIG. 24A.
Figure 24C:
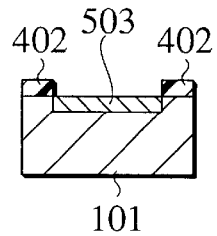
FIG. 24C is a cross-sectional view taken on line XXIV II—XXIV II of FIG. 24A.

(a) At first, a resist film 402 is spin-coated on the top surface of the (100) oriented single crystal substrate 101. With the ion-implantation mask 402 made of resist film, silicon ions ($^{28}$Si$^+$) are implanted through the window 412 as shown in FIGS. 24A to 24C so as to generate a damaged layer 503.

Figure 25A:
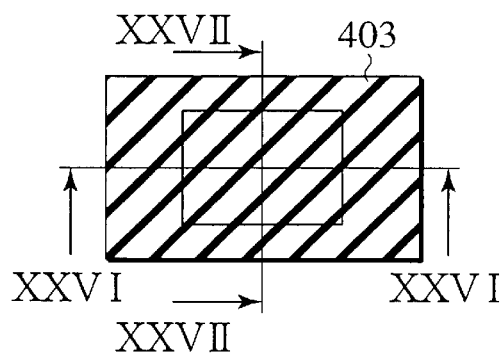
FIG. 25A is a top view illustrating the manufacturing method of the gettering unit according to the sixth embodiment.
Figure 25B:
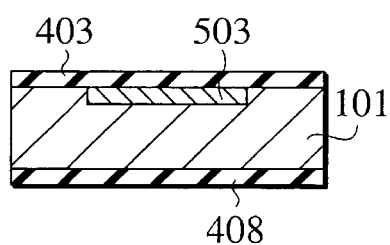
FIG. 25B is a cross-sectional view taken on line XXV I—XXV I of FIG. 25A.
Figure 25C:
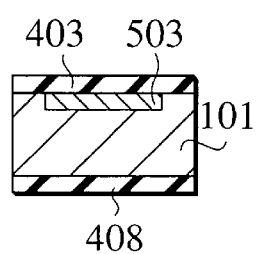
FIG. 25C is a cross-sectional view taken on line XXV II—XXV II of FIG. 25A.

(b) Next, the single crystal substrate 101 is annealed in an oxidation ambient so that the top thermal silicon oxide film 403 is formed on the top surface of the substrate 101 and the bottom thermal silicon oxide film 408 is formed on the bottom surface of the substrate 101 as shown in FIGS. 25A to 25C.

Figure 26B:
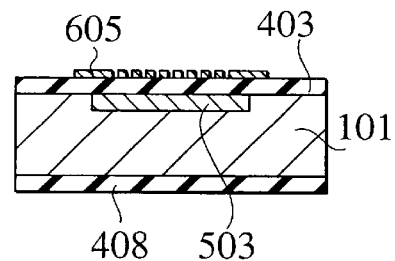
FIG. 26B is a cross-sectional view taken on line XXVI I—XXVI I of FIG. 26A.
Figure 26C:
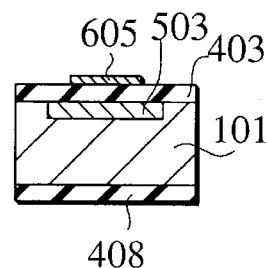
FIG. 26C is a cross-sectional view taken on line XXVI II—XXVI II of FIG. 26A.

(c) Next, a polysilicon film is deposited on the top thermal silicon oxide film 403 by the LP-CVD method. And, impurities are doped in the polysilicon film so as to form a doped polysilicon film. Then, the doped polysilicon film is delineated so as to form the meandering thin film heater 605 on the top thermal silicon oxide film 403 as shown in FIGS. 26A to 26C.

Figure 27A:
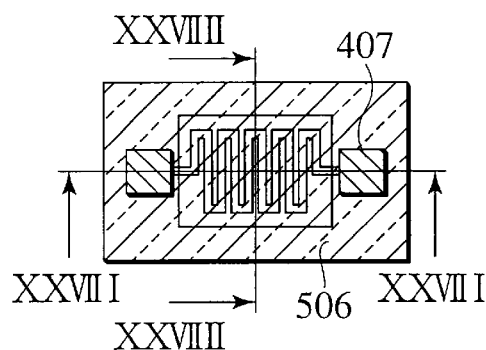
FIG. 27A is a top view illustrating the manufacturing method of the gettering unit according to the sixth embodiment.
Figure 27B:
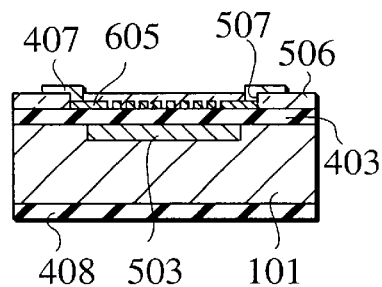
FIG. 27B is a cross-sectional view taken on line XXVII I—XXVII I of FIG. 27A.
Figure 28B:
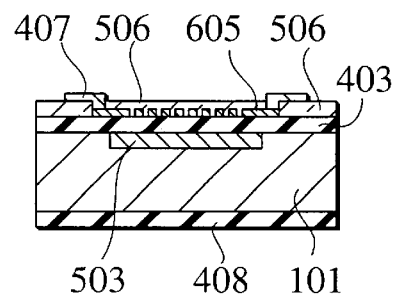
FIG. 28B is a cross-sectional view taken on line XXVIII I—XXVIII I of FIG. 28A.
Figure 27C:
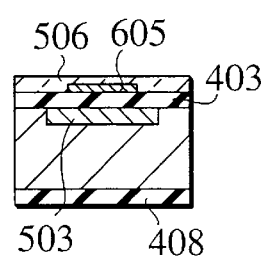
FIG. 27C is a cross-sectional view taken on line XXVII II—XXVII II of FIG. 27A.

(d) Next, a phosphosilicate glass (PSG) film 506 is deposited on the meandering thin film heater 605 by the APCVD method. And, contact holes 507 for connecting surface interconnections 407 to end terminals of the meandering thin film heater 605 are opened in the PSG film 506. Next, a metallic film is deposited by the sputtering method or the EB evaporation method, etc. Afterwards, the metallic film is delineated so as to form the surface interconnections 407 as shown in FIGS. 27A to 27C.

Figure 28C:
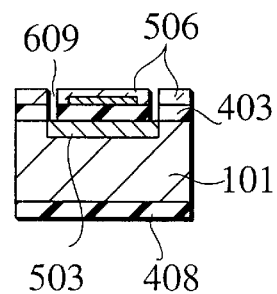
FIG. 28C is a cross-sectional view taken on line XXVIII II—XXVIII II of FIG. 28A.

(e) Next, a couple of concave polygonal etching windows 609 for silicon etching are opened, selectively removing the PSG film 506 and the top thermal silicon oxide film 403 so as to expose the top surface of the damaged layer 503 as shown in FIGS. 28A and 28C.

Figure 29B:
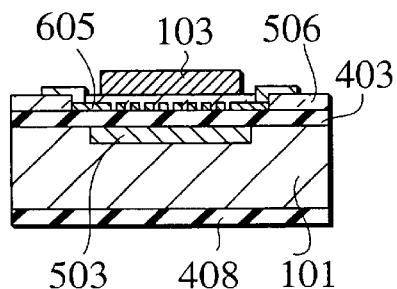
FIG. 29B is a cross-sectional view taken on line XXIX I—XXIX I of FIG. 29A.
Figure 29C:
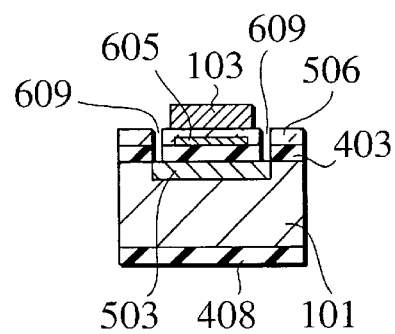
FIG. 29C is a cross-sectional view taken on line XXIX II—XXIX II of FIG. 29A.

(f) Next, a gettering layer 103 is selectively coated on the PSG film 506 by the methods such as the screen-printing technique as shown in FIGS. 29A to 29C.

(g) Next, the damaged layer 503, having higher etching rate, are selectively removed so as to form a thin hollow space through the concave polygonal etching windows 609, employing the anisotropic silicon etching solution. Further, as shown in FIGS. 30A, 30B and 30C, the single crystal substrate 101 under the meandering thin film heater 605 are also removed so as to form the limited hollow space (or the cavity) 611, providing the anisotropic silicon etching solution through the etching windows 609 and the thin hollow space. Then the meandering thin film heater 605 is thermally isolated.

The assembling process is similar to the process already explained in the first embodiment, and the overlapped description or the redundant description may be omitted in the sixth embodiment. According to the manufacturing method for the gettering unit of the sixth embodiment, the all-embracing process simplification from the manufacturing to the assembling process of the gettering unit can be achieved, and the reduction of the manufacturing cost become possible.

(Seventh Embodiment)

As shown in FIGS. 39A and 39B, a semiconductor integrated circuit according to the seventh embodiment merges an active element and a gettering unit in a single semiconductor chip (single crystal substrate) 101. The single crystal substrate 101 has top and bottom surfaces, and the top surface includes a first area and a second area neighboring to the first area. The gettering unit is disposed in the first area, while the active element is disposed in the second area. Here, the active element is an infrared sensor of thermopile structure.

In details, the integrated circuit according to the seventh embodiment encompasses a single crystal substrate 101 having first and second grooves dug from the top surface so as to form first and second limited hollow spaces (or first and second cavities) 714, a top insulating film 403 disposed on the top surface of the substrate 101 so as to include the first and second cavities 714, a bottom insulating film 408 disposed on the bottom surface of the substrate 101, a thin film heater 505 disposed selectively on the top insulating film 403, a thermally insulating layer 506 disposed on the thin film heater 505, a final passivation film 711 disposed on the thermally insulating layer 506 and a gettering layer 103 disposed selectively on the final passivation film 711. The top and bottom insulating films 403 and 408 may be a silicon oxide (SiO$_2$) film, for example. The thermally insulating layer 5 may be a phosphosilicate glass (PSG) film or boro-phosphosilicate glass (BPSG) film, for example. The final passivation film 711 may be a silicon nitride (Si$_3$N$_4$) film, for example. The gettering layer 103 selves as a thin film gettering means for adsorbing gaseous molecules in an enclosed space of a package. The thin film heater 505 serves as a thin film heating means for heating two dimensionally the gettering means 103 so as to activate uniformly gettering action of the gettering means 103. The semiconductor substrate 101 is a supporting means for supporting the gettering means 103 and heating means 505. The first cavity 714 serves as a part of a thermal isolation means for suppressing heat conduction from the heating means 505 to outer environment.

The same crystallographic plane, or the Miller indices of the top and bottom surfaces of the single crystal substrate 101 is selected as the fourth to sixth embodiments, or the (100) orientation is selected. In the integrated circuit according to the seventh embodiment, the first and second groove dug from the top surface of the single crystal substrate 101 so as to form the first and second limited hollow space 714. The thin film heater 505 is thermally isolated by the first limited hollow space 714. Furthermore, the aspect that the thin film heater 505 is made of doped polysilicon film is same as the fifth and sixth embodiments. In the thin film heater 505, either the first conductivity type or a second conductivity type impurity opposite to the first conductivity type impurity can be doped. The thin film heater 505 implements the diaphragm configuration supported by the top silicon oxide film 403. The thin film heater 505 has first and second end terminals. And surface interconnections (or the metallic electrodes) 710 contact with the first and second end terminals through contact holes opened in the thermally insulating layer 506. The two surface interconnections 710 in the first area, electrically connected to the thin film heater 505, serve as the bonding pads in the assembling process to form the vacuum encapsulated package. The surface interconnections 710 in the second area, electrically connected to the thermopiles 707, 719, 720 have bonding pads, which are also employed in the assembling process to form the vacuum encapsulated package.

As shown in FIGS. 39A and 39B, at the top surface side of the single crystal substrate 101, a couple of the isolation slits 712 are formed so as to thermally isolate the thin film heater 505 from the neighboring portion of the single crystal substrate 101. The isolation slits 712 serve as another parts of the thermal isolation means for suppressing heat conduction from the heating means (the thin film heater) 505 to outer environment. Other structure and materials are similar to the structure and materials already explained in the fifth and sixth embodiments, and the overlapped description or the redundant description might be omitted in the seventh embodiment.

In the integrated circuit according to the seventh embodiment, the mechanical strength is high because there is no isolation slits 415 (See FIG. 16C) which penetrates the single crystal substrate 101.

The manufacturing method of the integrated circuit according to the seventh embodiment is explained with FIGS. 31A to 39B. Though only one set of the gettering unit and the infrared sensor is shown in these figures, a large number of the chip patterns are fabricated simultaneously on a single substrate and are divided finally to provide plurality of the integrated circuit chips, similar to the first embodiment. And, one integrated circuit may be fabricated from one substrate using the substrate of the desired size. In the seventh embodiment, a silicon substrate 101 having the top and bottom surface of (100) plane is employed for the single crystal substrate 101.

Figure 31A:
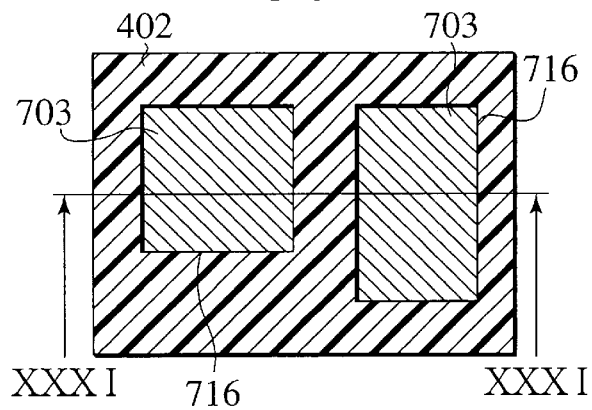
FIG. 31A is a top view illustrating the manufacturing method of a integrated circuit merging the gettering unit and a sensing element in a single semiconductor chip according to the seventh embodiment of the present invention.
Figure 31B:
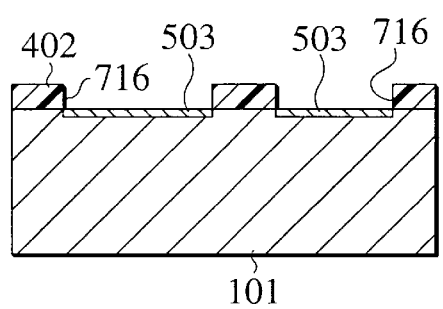
FIG. 31B is a cross-sectional view taken on line XXXI—XXXI of FIG. 31A.

(a) At first, a resist film 402 is spin-coated on the top surface of the (100) oriented single crystal substrate 101. And a resist pattern 402 serving as an ion-implantation mask, having first and second windows 716 at first and second areas scheduled for forming the first and second cavities (first and second limited hollow spaces) 714 for the gettering unit and the infrared sensor is delineated. Similar to the fifth and sixth embodiments, using the ion-implantation mask 402, silicon ions ($^{28}Si^+$) are implanted through the windows 716 as shown in FIGS. 31A and 31B so as to generate a damaged layer 503.

Figure 32A:
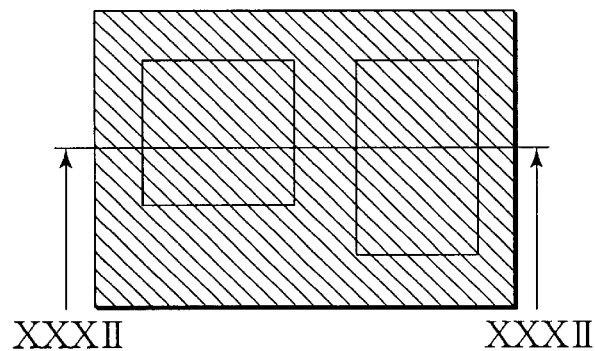
FIG. 32A is a top view illustrating the manufacturing method of the gettering unit and sensing element according to the seventh embodiment.
Figure 32B:
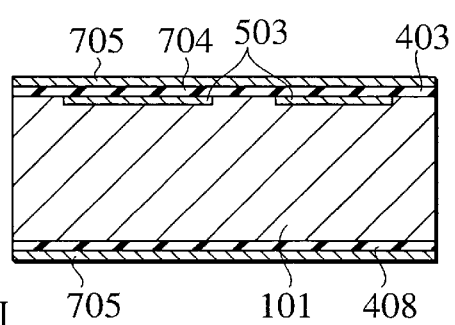
FIG. 32B is a cross-sectional view taken on line XXXII—XXXII of FIG. 32A.
Figure 33A:
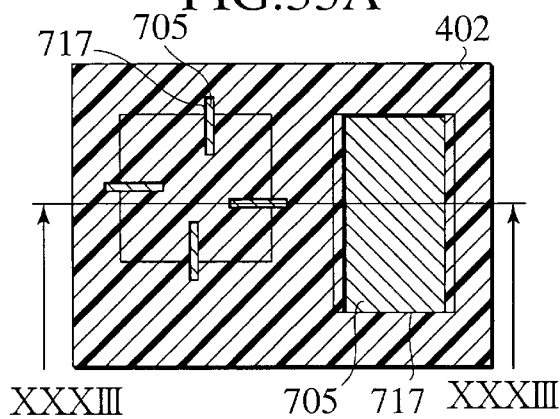
FIG. 33A is a top view illustrating the manufacturing method of the integrated circuit according to the seventh embodiment.
Figure 33B:
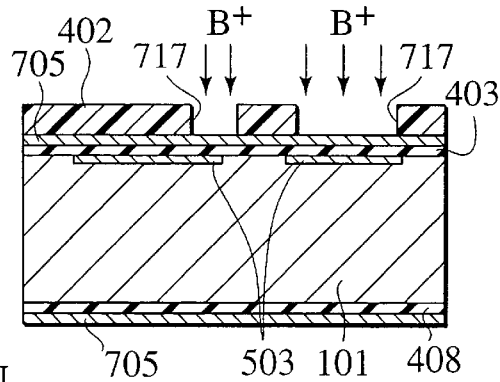
FIG. 33B is a cross-sectional view taken on line XXXIII—XXXIII of FIG. 33A.

(b) Next, the single crystal substrate 101 is annealed in an oxidation ambient so that the top thermal silicon oxide film 403 is formed on the top surface of the substrate 101 and the bottom thermal silicon oxide film 408 is formed on the bottom surface of the substrate 101 as shown in FIGS. 32A and 32B. Further, a polysilicon film 705 is deposited on the top thermal silicon oxide film 403 by methods such as the LP-CVD method.

(c) Next, a new resist film 402 is spin-coated on the polysilicon film 705. And a new resist pattern 402 serving as another ion-implantation mask, having first and second windows 717 at first and second areas scheduled for the gettering unit and for one of thermopile in the infrared sensor is delineated. With new ion-implantation mask 402, p-type impurity ions such as boron ions ($^{11}B^+$) are implanted through the windows 717 as shown in FIGS. 32A and 32B so as to form a p-type doped polysilicon film. Then the new ion-implantation mask 402 for p-type impurity implantation is removed. Next, a new resist film 402 is spin-coated on the polysilicon film 705. And another new resist pattern serving as still another ion-implantation mask, having a window at portions scheduled for another of thermopile in the infrared sensor is delineated. With the still new ion-implantation mask, n-type impurity ions such as phosphorus ions ($^{31}P^+$) or arsenic ions ($^{75}As^+$) are implanted through the window so as to form a n-type doped polysilicon film. However, the order and positions for p-type or n-type impurity ions are implanted can be the interchanged.

Figure 34A:
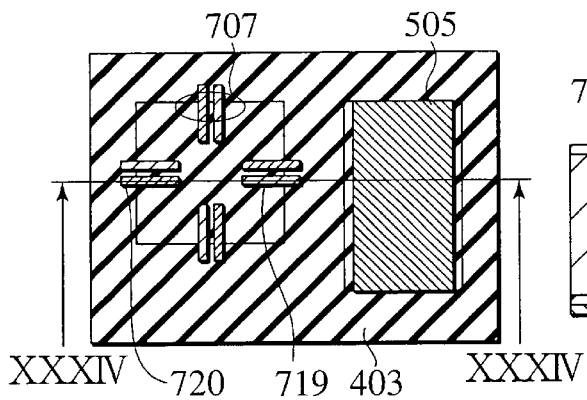
FIG. 34 is a top view illustrating the manufacturing method of the integrated circuit according to the seventh embodiment.
FIG. 34B is a cross-sectional view taken on line XXXIV—XXXIV of FIG. 34A.
Figure 34B:
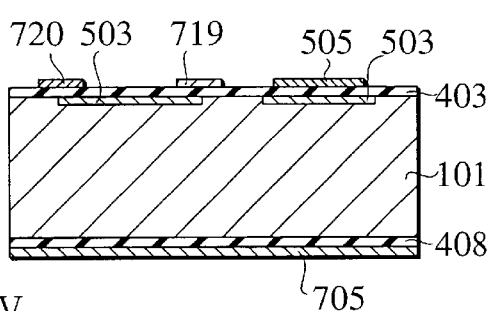

(d) Then, the p-type and n-type doped polysilicon films are delineated on the top thermal silicon oxide film 4 so as to form the thermopiles 707, 719, 720 in the second area. Simultaneously, the thin film heater (or the polysilicon resistance) 505 is defined in the first area on the top thermal silicon oxide film 403 as shown in FIGS. 34A and 34B.

Figure 35A:
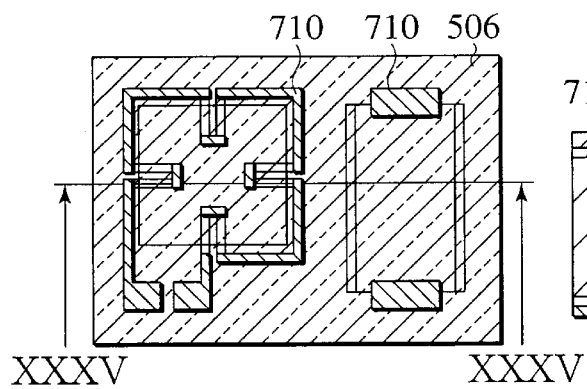
FIG. 35A is a top view illustrating the manufacturing method of the integrated circuit according to the seventh embodiment.
Figure 35B:
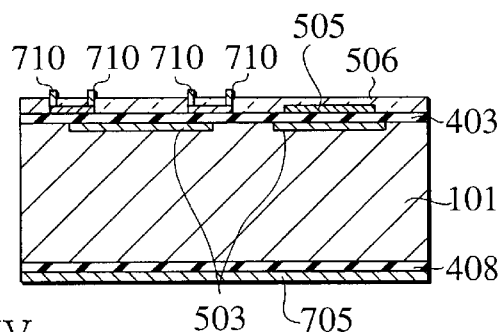
FIG. 35B is a cross-sectional view taken on line XXXV—XXXV of FIG. 35A.

(e) Next, a phosphosilicate glass (PSG) film 506 is deposited on the thermopiles 707, 719, 720 and the thin film heater 505 by methods such as the APCVD method. And, contact holes for connecting surface interconnections 710 to the thermopiles 707, 719, 720 and the thin film heater 505 are opened in the PSG film 506. Next, a metallic film such as an Al film and Al—Si film is deposited by the sputtering method or the EB evaporation method, etc. Afterwards, the metallic film is delineated so as to form the surface interconnections 710 contacting with the thermopiles 707, 719, 720 and with the thin film heater 505 as shown in FIGS. 35A and 35B.

Figure 36A:
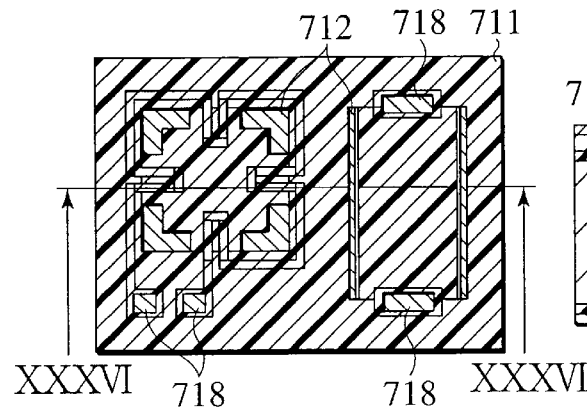
FIG. 36A is a top view illustrating the manufacturing method of the integrated circuit according to the seventh embodiment.
Figure 36B:
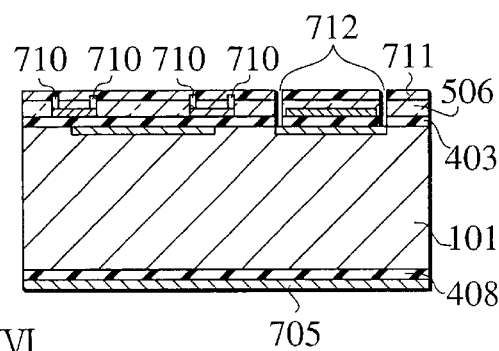
FIG. 36B is a cross-sectional view taken on line XXXVI—XXXVI of FIG. 36A.

(f) Next, a final passivation film 711 made of, for example, a silicon nitride ($Si_3N_4$) film, etc. is deposited by plasma CVD method, etc. Next, a couple of straight slit-like etching windows 712 for silicon etching are opened, selectively removing the final passivation film 711, the PSG film 506 and the top thermal silicon oxide film 403 so as to expose the top surface of the damaged layer 503 as shown in FIGS. 36A and 36C.

(g) Next, a gettering layer 103 is selectively coated on the final passivation film 711 by the methods such as the screen-printing technique as shown in FIGS. 37A and 37B.

(h) Next, the damaged layer 503, having higher etching rate, are selectively removed so as to form a thin hollow space through the straight slit-like etching windows 712, employing the anisotropic silicon etching solution such as the hydrazine. Further, as shown in FIGS. 38A and 38B, the single crystal substrate 101 under the infrared sensor detecting element and the thin film heater 505 are also removed so as to form the limited hollow space (or the cavity) 714, providing the anisotropic silicon etching solution through the straight slit-like etching windows 712 and the thin hollow space. Since etching rate for (111) plane by the hydrazine solution is lower than (100) plane, the (111) planes appear at the sidewalls of the first and second cavities 714. Then the infrared sensor detecting element and the thin film heater 505 is thermally isolated.

(i) Finally, an infrared absorption film 715 of gold black, etc is deposited on the final passivation film 711, and the integrated circuit merging the infrared sensor of thermopile structure and the gettering unit in the identical semiconductor chip are completed as shown in FIGS. 39A and 39B.

The assembling process is similar to the process already explained in the first embodiment, and the overlapped description or the redundant description may be omitted in the seventh embodiment.

In the integrated circuit according to the seventh embodiment, the infrared sensor and the gettering unit are merged in a single semiconductor chip. The manufacturing method for the integrated circuit according to the seventh embodiment is easily realizable only by adding the gettering layer formation process to the sensor manufacturing method, because the gettering unit is fabricated based upon the semiconductor manufacturing technology.

According to the manufacturing method for the integrated circuit of the seventh embodiment, the all-embracing process simplification from the manufacturing to the assembling process of the gettering unit and the infrared sensor can be achieved, and the reduction of the manufacturing cost become possible.

In addition, though in the integrated circuit according to the seventh embodiment, the infrared sensor has been explained as an example, it is clear that the present invention is applicable to any other semiconductor sensors, such as an angular velocity sensor and an acceleration sensor, as far as the functional portion is required to be encapsulated in a reduced pressure environment, and configured such that a plurality of elements are integrated on a semiconductor chip.

(Other Embodiments)

Various modifications will become possible for those skilled in the art after receiving the teaching of the present disclosure without departing from the scope thereof. And, the present invention of course includes various embodiments and modifications and the like which are not detailed above.

What is claimed is:

1. A gettering unit comprising:
   a substrate having top and bottom surfaces;
   a thin film heater disposed on the top surface of the substrate;
   a gettering layer disposed on the thin film heater; and
   a buffer layer sandwiched between said thin film heater and said gettering layer, said buffer layer made of an insulating material not reacting with both of said gettering layer and said thin film heater at an activation temperature of said gettering layer.

2. The gettering unit of claim 1, wherein said thin film heater comprises metallic film.

3. The gettering unit of claim 2, further comprising a cavity disposed under said gettering layer.

4. The gettering unit of claim 1, wherein said thin film heater comprises a doped polysilicon film.

5. The gettering unit of claim 4, further comprising a cavity disposed under said gettering layer.

6. The gettering unit of claim 1, further comprising a cavity disposed under said gettering layer.

7. The gettering unit of claim 6, wherein said thin film heater has a meandering topology, turning back and forth so as not being a straight segment.

8. The gettering unit of claim 6, wherein said semiconductor substrate further has a first concave polygonal slit and a second concave polygonal slit facing to the first concave polygonal slit, defining area for the thin film heater between the first and second concave polygonal slits.

9. A gettering unit comprising:
   a substrate having top and bottom surfaces;
   a thin film heater disposed on the top surface of the substrate;
   a gettering layer disposed on the thin film heater; and
   a solid thermally insulating layer sandwiched between said substrate and said thin film heater.

10. The gettering unit of claim 9, further comprising a cavity disposed beneath said thermally insulating layer just under said gettering layer, the space for the cavity being defined by a bottom surface of said thermally insulating layer and crystallographic planes of the substrate exposed in the substrate.

11. The gettering unit of claim 10, wherein said semiconductor substrate further has a first isolation slit and a second isolation slit running parallel to the first isolation slit, defining area for the thin film heater between the first and second isolation slits.

12. The gettering unit of claim 9, wherein said thin film heater comprises a metallic film.

13. The gettering unit of claim 9, wherein said thin film heater comprises a doped polysilicon film.

14. A gettering unit comprising:
   a first conductivity type semiconductor substrate having top and bottom surfaces;
   a second conductivity type impurity doped region disposed at the top surface and in the semiconductor substrate, the impurity doped region serving as a thin film heater, the second conductivity type being opposite to the first conductivity type; and
   a gettering layer disposed on the thin film heater.

15. The gettering unit of claim 14, wherein said semiconductor substrate has a groove dug from the bottom surface to expose said impurity doped region, configured to provide a diaphragm structure made of said impurity doped region.

16. The gettering unit of claim 15, wherein said semiconductor substrate further has a first isolation slit and a second isolation slit running parallel to the first isolation slit, defining area for the thin film heater between the first and second isolation slits.

17. The gettering unit of claim 15, further comprising a buffer layer sandwiched between said thin film heater and said gettering layer, said buffer layer made of an insulating material not reacting with both of said gettering layer and said thin film heater at an activation temperature of said gettering layer.

18. An encapsulated semiconductor device comprising:
   a stem having plurality of feedthrough lines;
   a active element chip mounted on the stem having plurality of bonding pads;

an auxiliary chip mounted on the stem, the auxiliary chip having top and bottom surfaces;

a thin film heater disposed on the top surface of the auxiliary chip having first and second end terminals;

a gettering layer disposed on the thin film heater;

a first set of bonding wires connecting between said bonding pads to corresponding feedthrough lines, respectively;

a second set of bonding wires connecting between said first and second end terminals to corresponding feedthrough lines, respectively; and a cap bonded to said stem so as to encapsulate said active element chip and said auxiliary chip.

19. A method for manufacturing a gettering unit comprising:

(a) depositing a solid thermally insulating layer on a substrate;

(b) depositing a resistive material on the solid thermally insulating layer;

(c) delineating said resistive material so as to form a thin film heater;

(d) depositing a buffer layer on the thin film heater;

(e) depositing gettering material on the buffer layer; and (f) delineating said gettering material so as to form a gettering layer, wherein said buffer layer is made of an insulating material not reacting with both of said gettering layer and thin film heater at an activation temperature of said gettering layer.

20. A semiconductor integrated circuit comprising:

a semiconductor substrate having top and bottom surfaces, the top surface embracing a first area and a second area neighboring to the first area;

a thin film heater disposed selectively on the first area;

a solid thermally insulating layer sandwiched between said semiconductor substrate and said thin film heater;

a gettering layer disposed selectively on the thin film heater; and an active element disposed in the second area.

21. A method for manufacturing a gettering unit comprising:

(a) depositing resistive material on a substrate;

(b) delineating said resistive material so as to form a thin film heater;

(b) depositing buffer layer on the thin film heater;

(c) depositing gettering material on the buffer layer;

(d) delineating said gettering material so as to form a gettering layer, and (f) etching selectively a portion of the substrate just under the thin film heater, from the bottom surface of the substrate, so as to form a groove serving as a thermal insulating space, wherein said buffer layer is made of an insulating material not reacting with both of said gettering layer and said thin film heater at an activation temperature of said gettering layer.

22. A semiconductor integrated circuit comprising:

a semiconductor substrate having top and bottom surfaces, the top surface embracing a first area and a second area neighboring to the first area;

a thin film heater disposed selectively on the first area;

a gettering layer disposed selectively on the thin film heater;

a buffer layer sandwiched between said thin film heater and said gettering layer, said buffer layer made of an insulating material not reacting with both of said gettering layer and said thin film heater at an activation temperature of said gettering layer; and an active element disposed in the second area.

23. The semiconductor integrated circuit of claim 22, further comprising a first cavity disposed beneath said thermally insulating layer just under said gettering layer, the space for the cavity being defined by a bottom surface of said thermally insulating layer and crystallographic planes of the substrate exposed in the substrate.

* * * * *